(12) United States Patent
Sun et al.

(10) Patent No.: US 11,606,167 B2
(45) Date of Patent: Mar. 14, 2023

(54) ETHERNET DATA TRANSMISSION METHOD AND COMMUNICATIONS DEVICE

(71) Applicant: Huawei Technologies Co., Ltd., Shenzhen (CN)

(72) Inventors: Desheng Sun, Shenzhen (CN); Yongzhi Liu, Dongguan (CN); Li Ding, Shenzhen (CN); Zhigang Zhu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/457,584

(22) Filed: Dec. 3, 2021

(65) Prior Publication Data

US 2022/0094463 A1 Mar. 24, 2022

Related U.S. Application Data

(63) Continuation of application No. PCT/CN2020/092211, filed on May 26, 2020.

(30) Foreign Application Priority Data

Jun. 4, 2019 (CN) .......................... 201910483078.6

(51) Int. Cl.
*H03M 13/00* (2006.01)
*H04L 1/00* (2006.01)
(Continued)

(52) U.S. Cl.
CPC ........ *H04L 1/004* (2013.01); *H03M 13/2906* (2013.01); *H04L 1/0006* (2013.01); *H04L 69/324* (2013.01)

(58) Field of Classification Search
None
See application file for complete search history.

(56) References Cited

U.S. PATENT DOCUMENTS

| 8,761,209 B1 * | 6/2014 | Brown ................. H04L 12/413 370/535 |
| 10,069,660 B1 | 9/2018 | Sun et al. |

(Continued)

FOREIGN PATENT DOCUMENTS

| CN | 1316146 A | 10/2001 |
| CN | 103875205 A | 6/2014 |

(Continued)

OTHER PUBLICATIONS

Sun, P., "Feasibility of 50GE Low latency Schemes", Credo, 2016, 12 pages.

(Continued)

*Primary Examiner* — Mujtaba M Chaudry
(74) *Attorney, Agent, or Firm* — Slater Matsil, LLP

(57) ABSTRACT

A method includes: sending, by a first device, a first bit stream to a second device, where the first bit stream is sent over N logical lanes of a physical layer of the first device; sending, by the first device, a first trigger marker group to the second device, where the first trigger marker group is used to indicate that the sending of the first bit stream ends; and sending, by the first device, a second bit stream to the second device in response to the sending of the first trigger marker group, where the second bit stream is sent over P logical lanes of the physical layer of the first device, and both N and P are positive integers.

20 Claims, 23 Drawing Sheets

(51) Int. Cl.
*H03M 13/29* (2006.01)
*H04L 69/324* (2022.01)

(56) References Cited

U.S. PATENT DOCUMENTS

| | | | | |
|---|---|---|---|---|
| 2008/0069052 A1* | 3/2008 | Mezer | H04L 1/0045 | |
| | | | 370/332 | |
| 2010/0083066 A1* | 4/2010 | Sivaramakrishnan | | |
| | | | H04L 1/0006 | |
| | | | 710/110 | |
| 2015/0205339 A1* | 7/2015 | Park | G06F 1/3278 | |
| | | | 713/323 | |
| 2016/0056914 A1* | 2/2016 | Gareau | H04J 3/1652 | |
| | | | 398/52 | |
| 2017/0012738 A1* | 1/2017 | Mantiply | H04L 1/0061 | |
| 2017/0170927 A1* | 6/2017 | Stone | H04L 1/0041 | |
| 2017/0324657 A1* | 11/2017 | Zhong | H04L 1/0011 | |
| 2019/0174554 A1* | 6/2019 | Deenoo | H04W 48/14 | |

FOREIGN PATENT DOCUMENTS

| | | |
|---|---|---|
| CN | 104185976 A | 12/2014 |
| CN | 108242969 A | 7/2018 |
| WO | 2009123988 A1 | 10/2009 |

OTHER PUBLICATIONS

IEEE Standards Association, "IEEE Standard for Ethernet", LAN/MAN Standards Committee of the IEEE Computer Society, IEEE Std 8-2.3™—2018, Approved Jun. 14, 2018, 5600 pages.

* cited by examiner

| | D0 | D1 | | D2 | | D3 | | D4 | | D5 | | D6 | | D7 |
|---|---|---|---|---|---|---|---|---|---|---|---|---|---|---|
| 01 | 0x1E | C0 | | C1 | | C2 | | C3 | | C4 | | C5 | | C6 | | D7 |
| 10 | 0x2D | C0 | | C1 | | C2 | | C3 | | O4 | | D5 | | C6 | | C7 |
| 10 | 0x33 | C0 | | C1 | | C2 | | C3 | | | | D5 | | D6 | | D7 |
| 10 | 0x66 | D1 | | D2 | | D3 | | O0 | | | | D5 | | D6 | | D7 |
| 10 | 0x55 | D1 | | D2 | | D3 | | O0 | | | | D5 | | D6 | | D7 |
| 10 | 0x78 | D1 | | D2 | | D3 | | D4 | | | | D5 | | D6 | | D7 |
| 10 | 0x4B | D1 | | C1 | | C2 | | C3 | | O0 | | C5 | | C6 | | C7 |
| 10 | 0x87 | | | | | | | | | C4 | | C5 | | C6 | | C7 |
| 10 | 0x99 | D1 | | D2 | | D3 | | C3 | | C4 | | C5 | | C6 | | C7 |
| 10 | 0xAA | D1 | | D2 | | D3 | | C3 | | C4 | | C5 | | C6 | | C7 |
| 10 | 0xB4 | D1 | | D2 | | D3 | | | | C4 | | C5 | | C6 | | C7 |
| 10 | 0xCC | D1 | | D2 | | D3 | | D4 | | | | C5 | | C6 | | C7 |
| 10 | 0xD2 | D1 | | D2 | | D3 | | D4 | | D5 | | | | C6 | | C7 |
| 10 | 0xE1 | D1 | | D2 | | D3 | | D4 | | D5 | | D6 | | | | C7 |
| 10 | 0xFF | D1 | | D2 | | D3 | | D4 | | D5 | | D6 | | D6 | | D7 |

FIG. 6

| FECL index | AM | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 |
|---|---|---|---|---|---|---|---|---|---|---|---|---|---|---|---|---|---|---|---|---|---|---|---|---|---|---|---|---|---|---|---|---|---|---|---|
| 0 | | | | | | o amp_tx_0 $_{63}$ | | | | o amp_tx_4 $_{63}$ | | | | o amp_tx_8 $_{63}$ | | | | | | | o amp_tx_12 $_{63}$ | | | | | | o amp_tx_16 $_{63}$ | | | | | | | | |
| 1 | | | o amp_tx_1 $_{63}$ | | | | | | o amp_tx_5 $_{63}$ | | | | o amp_tx_9 $_{63}$ | | | | | | | o amp_tx_13 $_{63}$ | | | | | | o amp_tx_17 $_{63}$ | | | | | | | | | |
| 2 | | | o amp_tx_2 $_{63}$ | | | | | | o amp_tx_6 $_{63}$ | | | | o amp_tx_10 $_{63}$ | | | | | | | o amp_tx_14 $_{63}$ | | | | | | o amp_tx_18 $_{63}$ | | | | | | | | | |
| 3 | | | o amp_tx_3 $_{63}$ | | | | | | o amp_tx_7 $_{63}$ | | | | o amp_tx_11 $_{63}$ | | | | | | | o amp_tx_15 $_{63}$ | | | | | | o amp_tx_19 $_{63}$ | | | | | | | | | |

FIG.27

ETHERNET DATA TRANSMISSION METHOD AND COMMUNICATIONS DEVICE

CROSS-REFERENCE TO RELATED APPLICATIONS

This application is a continuation of International Application No. PCT/CN2020/092211, filed on May 26, 2020, which claims priority to Chinese Patent Application No. 201910483078.6, filed on Jun. 4, 2019. The disclosures of the aforementioned applications are hereby incorporated by reference in their entireties.

TECHNICAL FIELD

This application relates to the communications field, and specifically, to an Ethernet data transmission method and a communications device.

BACKGROUND

When there is no user data transmission over an entire Ethernet interface, some elements at a physical layer of the Ethernet interface may enter a deep sleep mode. A higher-speed Ethernet interface has a larger bandwidth and can provide services for more users. Because of the large number of connected users, no user data transmission over the higher-speed Ethernet interface rarely occurs. Therefore, it is difficult for higher-speed Ethernet to reduce power consumption by using this scheme.

For the Ethernet interface, a bit stream is usually encoded and decoded by using a relatively strong forward error correction (FEC) scheme, such as a Reed-Solomon (RS) encoding and decoding scheme, which introduces a relatively high latency and wastes system resources.

SUMMARY

This application provides an Ethernet data transmission method, which can perform bit-error-free switching of a working mode of a physical layer, so as to adjust power of an Ethernet interface, a latency of data transmission, and the like while ensuring the data transmission.

According to a first aspect, an Ethernet data transmission method is provided, including: sending, by a first device, a first bit stream to a second device, where the first bit stream is sent over N logical lanes of a physical layer of the first device; sending, by the first device, a first trigger marker group to the second device, where the first trigger marker group is used to indicate that the sending of the first bit stream ends; and sending, by the first device, a second bit stream to the second device in response to the sending of the first trigger marker group, where the second bit stream is sent over P logical lanes of the physical layer of the first device, and both N and P are positive integers.

The sending of a trigger marker group indicates a time at which a processing manner of a bit stream changes, so as to achieve bit-error-free switching of a working mode of a physical layer of the first device and the second device during transmission of the bit stream, and adjust power of an Ethernet interface, a latency of data transmission, and the like while ensuring the data transmission. The time at which the processing manner of the bit stream changes may also be understood as a position at which the processing manner changes in the bit stream.

Changing the number of logical lanes can adjust a transmission rate of the bit stream, so that power consumption of a system can be reduced.

With reference to the first aspect, in some possible implementations, the first trigger marker group includes P trigger markers; and the sending, by the first device, a first trigger marker group to the second device includes: sending, by the first device, an $i^{th}$ trigger marker in the P trigger markers over an $i^{th}$ logical lane in the P logical lanes, where i is a positive integer.

Sending each trigger marker in the first trigger marker group to a corresponding logical lane can make a switching time accurate, and can make it compatible with an existing Ethernet data transmission procedure.

With reference to the first aspect, in some possible implementations, the first trigger marker group includes N trigger markers; and the sending, by the first device, a first trigger marker group to the second device includes: sending, by the first device, an $i^{th}$ trigger marker in the N trigger markers over an $i^{th}$ logical lane in the N logical lanes, where i is a positive integer.

Sending each trigger marker in the first trigger marker group to a corresponding logical lane can make a switching time accurate, and can make it compatible with an existing Ethernet data transmission procedure.

With reference to the first aspect, in some possible implementations, the $i^{th}$ trigger marker includes information for identifying the $i^{th}$ logical lane.

With reference to the first aspect, in some possible implementations, the first bit stream is encoded by using a first forward error correction FEC encoding scheme; and the second bit stream is encoded by using a second FEC encoding scheme, where an error correction capability of the second FEC encoding scheme is different from that of the first FEC encoding scheme.

Changing a FEC encoding scheme can adjust a transmission latency and improve the transmission efficiency.

With reference to the first aspect, in some possible implementations, one of the first bit stream and the second bit stream is encoded by using forward error correction FEC.

Changing a FEC encoding scheme can adjust a transmission latency and improve the transmission efficiency.

With reference to the first aspect, in some possible implementations, the first bit stream includes an anchor code block, and the anchor code block is used to indicate a time at which the sending of the first bit stream ends.

By means of the anchor code block, the first device and the second device may agree on a time at which the switching occurs, making the switching of the working mode of the physical layer more flexible.

With reference to the first aspect, in some possible implementations, the first trigger marker group is an alignment marker AM group.

Using an alignment marker AM as a trigger marker group can reduce impact on data transmission, and simplify a procedure of switching the working mode of the physical layer.

With reference to the first aspect, in some possible implementations, the method further includes: receiving a response code block that corresponds to the anchor code block and that is sent by the second device; and the sending, by the first device, a first trigger marker group to the second device includes: sending, by the first device, the first trigger marker group to the second device based on the response code block.

Determining the switching of the working mode by receiving the response code block can improve the reliability of the switching procedure.

According to a second aspect, an Ethernet data transmission method is provided, including: receiving, by a second device, a first bit stream sent by a first device, where the first bit stream is received over N logical lanes of a physical layer of the second device; receiving, by the second device, a first trigger marker group sent by the first device, where the first trigger marker group is used to indicate that the sending of the first bit stream ends; and receiving, by the second device in response to the receiving of the first trigger marker group, a second bit stream sent by the first device, where the second bit stream is received over P logical lanes of the physical layer of the second device, and both N and P are positive integers.

The receiving of a trigger marker group determines a time at which a processing manner of a bit stream changes, so as to achieve bit-error-free switching of a working mode of a physical layer of the first device and the second device during transmission of the bit stream, and adjust power of an Ethernet interface, a latency of data transmission, and the like while ensuring the data transmission. The time at which the processing manner of the bit stream changes may also be understood as a position at which the processing manner changes in the bit stream.

Changing the number of logical lanes can adjust a transmission rate of the bit stream, so that power consumption of a system can be reduced.

With reference to the second aspect, in some possible implementations, the first trigger marker group includes P trigger markers; and the receiving, by the second device, a first trigger marker group sent by the first device includes: receiving, by the second device, an $i^{th}$ trigger marker in the P trigger markers over an $i^{th}$ logical lane in the P logical lanes, where i is a positive integer.

With reference to the second aspect, in some possible implementations, the first trigger marker group includes N trigger markers; and the receiving, by the second device, a first trigger marker group sent by the first device includes: receiving, by the second device, an $i^{th}$ trigger marker in the N trigger markers over an $i^{th}$ logical lane in the N logical lanes, where i is a positive integer.

With reference to the second aspect, in some possible implementations, the $i^{th}$ trigger marker includes information for identifying the $i^{th}$ logical lane.

With reference to the second aspect, in some possible implementations, the first bit stream is encoded by using a first forward error correction FEC encoding scheme; and the second bit stream is encoded by using a second FEC encoding scheme, where an error correction capability of the second FEC encoding scheme is different from that of the first FEC encoding scheme; and the method includes: decoding, by the second device, the first bit stream by using a first FEC decoding scheme corresponding to the first FEC encoding scheme; and decoding, by the second device, the second bit stream by using a second FEC decoding scheme corresponding to the second FEC encoding scheme.

With reference to the second aspect, in some possible implementations, one of the first bit stream and the second bit stream is encoded by using forward error correction FEC; and the method includes: performing, by the second device, FEC decoding on the bit stream encoded by using forward error correction FEC.

With reference to the second aspect, in some possible implementations, the first bit stream includes an anchor code block, and the anchor code block is used to indicate a time at which the sending of the first bit stream ends.

With reference to the second aspect, in some possible implementations, the first trigger marker group is an alignment marker AM group.

With reference to the second aspect, in some possible implementations, the method further includes: sending, by the second device, a response code block corresponding to the anchor code block to the first device, where the anchor code block is used to indicate the sending of the first trigger marker group.

According to a third aspect, a communications device is provided, including: a communications interface, where the communications interface is configured to send a first bit stream to a second device, where the first bit stream is sent over N logical lanes of a physical layer of the communications interface; the communications interface is further configured to send a first trigger marker group to the second device, where the first trigger marker group is used to indicate that the sending of the first bit stream ends; and the communications interface is further configured to send a second bit stream to the second device in response to the sending of the first trigger marker group, where the second bit stream is sent over P logical lanes of the physical layer of the communications interface, and both N and P are positive integers.

With reference to the third aspect, in some possible implementations, the first trigger marker group includes P trigger markers; and the communications interface is configured to send an $i^{th}$ trigger marker in the P trigger markers over an $i^{th}$ logical lane in the P logical lanes, where i is a positive integer.

With reference to the third aspect, in some possible implementations, the first trigger marker group includes N trigger markers; and the communications interface is configured to send an $i^{th}$ trigger marker in the N trigger markers over an $i^{th}$ logical lane in the N logical lanes, where i is a positive integer.

With reference to the third aspect, in some possible implementations, the $i^{th}$ trigger marker includes information for identifying the $i^{th}$ logical lane.

With reference to the third aspect, in some possible implementations, the first bit stream is encoded by using a first forward error correction FEC encoding scheme; and the second bit stream is encoded by using a second FEC encoding scheme, where an error correction capability of the second FEC encoding scheme is different from that of the first FEC encoding scheme.

With reference to the third aspect, in some possible implementations, one of the first bit stream and the second bit stream is encoded by using forward error correction FEC.

With reference to the third aspect, in some possible implementations, the first bit stream includes an anchor code block, and the anchor code block is used to indicate a time at which the sending of the first bit stream ends.

With reference to the third aspect, in some possible implementations, the first bit stream includes an anchor code block, and the anchor code block is used to indicate a time at which the sending of the first bit stream ends.

With reference to the third aspect, in some possible implementations, the first trigger marker group is an alignment marker AM group.

With reference to the third aspect, in some possible implementations, the communications interface is further configured to: receive a response code block that corresponds to the anchor code block and that is sent by the second device; and send the first trigger marker group to the second device based on the response code block.

According to a fourth aspect, a communications device is provided, including: a communications interface, where the communications interface is configured to receive a first bit stream sent by a first device, where the first bit stream is received over N logical lanes of a physical layer of the communications interface; the communications interface is further configured to receive a first trigger marker group sent by the first device, where the first trigger marker group is used to indicate that the sending of the first bit stream ends; and the communications interface is further configured to receive, in response to the receiving of the first trigger marker group, a second bit stream sent by the first device, where the second bit stream is received over P logical lanes of the physical layer of the communications interface, and both N and P are positive integers.

With reference to the fourth aspect, in some possible implementations, the first trigger marker group includes P trigger markers; and the communications interface is configured to receive an $i^{th}$ trigger marker in the P trigger markers over an $i^{th}$ logical lane in the P logical lanes, where i is a positive integer.

With reference to the fourth aspect, in some possible implementations, the first trigger marker group includes N trigger markers; and the communications interface is configured to receive an $i^{th}$ trigger marker in the N trigger markers over an $i^{th}$ logical lane in the N logical lanes, where i is a positive integer.

With reference to the fourth aspect, in some possible implementations, the $i^{th}$ trigger marker includes information for identifying the $i^{th}$ logical lane.

With reference to the fourth aspect, in some possible implementations, the first bit stream is encoded by using a first forward error correction FEC encoding scheme; and the second bit stream is encoded by using a second FEC encoding scheme, where an error correction capability of the second FEC encoding scheme is different from that of the first FEC encoding scheme; and the communications device includes a processor, where the processor is configured to: decode the first bit stream by using a first FEC decoding scheme corresponding to the first FEC encoding scheme; and decode the second bit stream by using a second FEC decoding scheme corresponding to the second FEC encoding scheme.

With reference to the fourth aspect, in some possible implementations, one of the first bit stream and the second bit stream is encoded by using forward error correction FEC; and the communications device includes a processor, where the processor is configured to perform FEC decoding on the bit stream encoded by using forward error correction FEC.

With reference to the fourth aspect, in some possible implementations, the first bit stream includes an anchor code block, and the anchor code block is used to indicate a time at which the sending of the first bit stream ends.

With reference to the fourth aspect, in some possible implementations, the first trigger marker group is an alignment marker AM group.

With reference to the fourth aspect, in some possible implementations, the communications interface is further configured to send a response code block corresponding to the anchor code block to the first device, where the anchor code block is used to indicate the sending of the first trigger marker group.

According to a fifth aspect, a communications device is provided, including a generation module and a transceiver module, where the transceiver module is configured to send a first bit stream to a second device, where the first bit stream is sent over N logical lanes of a physical layer of the communications device. The generation module is configured to generate a first trigger marker group. The transceiver module is further configured to send the first trigger marker group to the second device, where the first trigger marker group is used to indicate that the sending of the first bit stream ends. The transceiver module is further configured to send a second bit stream to the second device in response to the sending of the first trigger marker group, where the second bit stream is sent over P logical lanes of the physical layer of the communications device, and both N and P are positive integers.

With reference to the fifth aspect, in some possible implementations, the first trigger marker group includes P trigger markers; and the transceiver module is configured to send an $i^{th}$ trigger marker in the P trigger markers over an $i^{th}$ logical lane in the P logical lanes, where i is a positive integer.

With reference to the fifth aspect, in some possible implementations, the $i^{th}$ trigger marker includes information for identifying the $i^{th}$ logical lane.

Optionally, the first bit stream is encoded by using a first forward error correction FEC encoding scheme; and the second bit stream is encoded by using a second FEC encoding scheme, where an error correction capability of the second FEC encoding scheme is different from that of the first FEC encoding scheme.

With reference to the fifth aspect, in some possible implementations, one of the first bit stream and the second bit stream is encoded by using forward error correction FEC.

With reference to the fifth aspect, in some possible implementations, the first bit stream includes an anchor code block, and the anchor code block is used to indicate a time at which the sending of the first bit stream ends.

With reference to the fifth aspect, in some possible implementations, the first trigger marker group is an alignment marker AM group.

With reference to the fifth aspect, in some possible implementations, the transceiver module is further configured to receive a response code block that corresponds to the anchor code block and that is sent by the second device; and the transceiver module is configured to send the first trigger marker group to the second device based on the response code block.

According to a sixth aspect, a communications device is provided, including a transceiver module and a processing module. The transceiver module is configured to receive a first bit stream sent by a first device, where the first bit stream is received over N logical lanes of a physical layer of the communications device. The transceiver module is further configured to receive a first trigger marker group sent by the first device, where the first trigger marker group is used to indicate that the sending of the first bit stream ends. The transceiver module is further configured to receive, in response to the receiving of the first trigger marker group, a second bit stream sent by the first device, where the second bit stream is received over P logical lanes of the physical layer of the communications device, and both N and P are positive integers. The processing module is configured to process the first bit stream and the second bit stream.

With reference to the sixth aspect, in some possible implementations, the first trigger marker group includes P trigger markers. The transceiver module is configured to receive an $i^{th}$ trigger marker in the P trigger markers over an $i^{th}$ logical lane in the P logical lanes, where i is a positive integer.

With reference to the sixth aspect, in some possible implementations, the first trigger marker group includes N trigger markers. The transceiver module is configured to receive an $i^{th}$ trigger marker in the N trigger markers over an $i^{th}$ logical lane in the N logical lanes, where i is a positive integer.

With reference to the sixth aspect, in some possible implementations, the $i^{th}$ trigger marker includes information for identifying the $i^{th}$ logical lane.

With reference to the sixth aspect, in some possible implementations, the first bit stream is encoded by using a first forward error correction FEC encoding scheme; and the second bit stream is encoded by using a second FEC encoding scheme, where an error correction capability of the second FEC encoding scheme is different from that of the first FEC encoding scheme. The processing module is configured to: decode the first bit stream by using a first FEC decoding scheme corresponding to the first FEC encoding scheme; and decode the second bit stream by using a second FEC decoding scheme corresponding to the second FEC encoding scheme.

With reference to the sixth aspect, in some possible implementations, one of the first bit stream and the second bit stream is encoded by using forward error correction FEC. The processing module is configured to perform FEC decoding on the bit stream encoded by using forward error correction FEC.

With reference to the sixth aspect, in some possible implementations, the first bit stream includes an anchor code block, and the anchor code block is used to indicate a time at which the sending of the first bit stream ends.

With reference to the sixth aspect, in some possible implementations, the first trigger marker group is an alignment marker AM group.

With reference to the sixth aspect, in some possible implementations, the transceiver module is further configured to send a response code block corresponding to the anchor code block to the first device, where the anchor code block is used to indicate the sending of the first trigger marker group.

According to a seventh aspect, a computer program storage medium is provided. The computer program storage medium has program instructions. When the program instructions are executed, the foregoing method is performed.

According to an eighth aspect, a chip is provided. The chip system includes at least one processor. When program instructions are executed by the at least one processor, the foregoing method is performed.

BRIEF DESCRIPTION OF THE DRAWINGS

FIG. 6 is a schematic diagram of types of 64B/66B code blocks specified by IEEE 802.3;

FIG. 2a to FIG. 12c are schematic diagrams of Ethernet data transmission according to another embodiment of this application;

FIG. 27 is a Table 2.

DETAILED DESCRIPTION OF ILLUSTRATIVE EMBODIMENTS

The following describes technical solutions in this application with reference to the accompanying drawings.

Ethernet-related standards released by the Institute of Electrical and Electronics Engineers (IEEE) 802.3 working group are well received by network equipment manufacturers for a simple best-effort transmission manner and a standardized interworking and interconnection mechanism defined by the standards. At present, Ethernet-based transmission technologies have been widely used in telecommunications networks.

Figure 1:
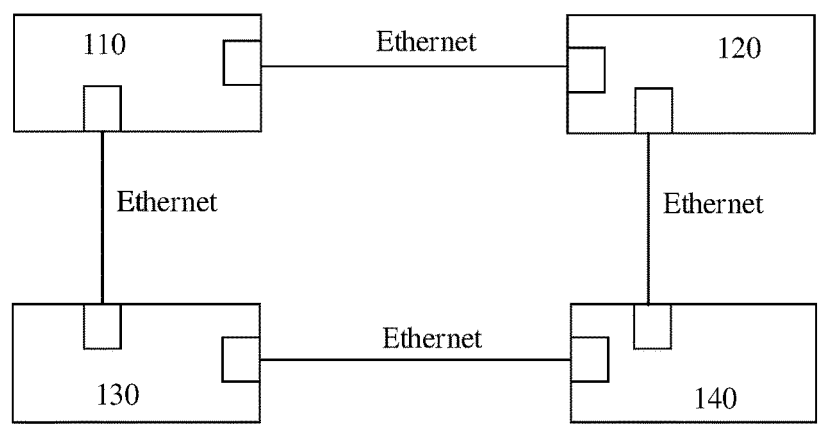
FIG. 1 is a schematic diagram of a network connected based on Ethernet technology.

FIG. 1 is a schematic diagram of a network connected based on Ethernet technology.

A communications device 110 performs user data transmission with a communications device 120 and a communications device 130 based on Ethernet, and a communications device 140 performs user data transmission with the communications device 120 and the communications device 130 based on Ethernet. Two communications devices that perform user data transmission based on Ethernet may be connected by means of a cable or an optical fiber.

Figure 2:
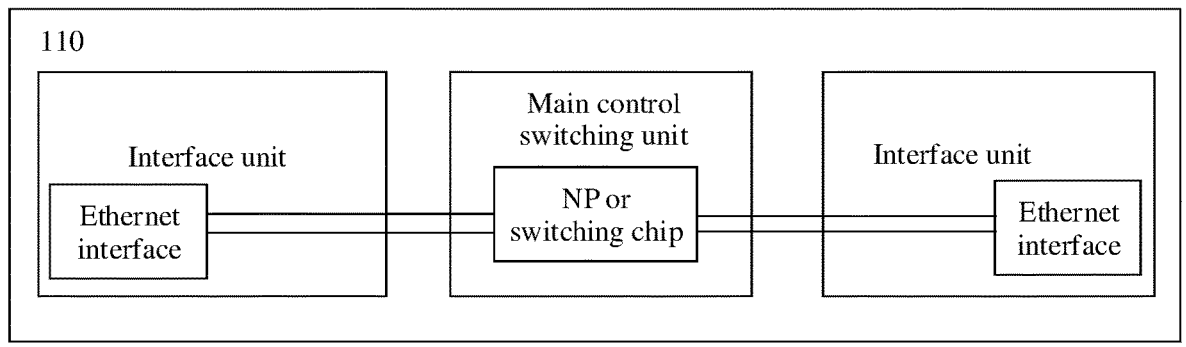
FIG. 2 is a schematic diagram of a structure of a communications device.

FIG. 2 is a schematic diagram of a structure of a communications device. The communications device 110 is used for Ethernet-based data transmission.

The communications device 110 includes a main control switching unit, an interface unit, and the like. The main control switching unit includes a network processor (NP) or a switching chip. The interface unit is used for information exchange between the device 110 and other devices. The interface unit includes an Ethernet interface. For a process of data transmission over the Ethernet interface, refer to FIG. 3 and FIG. 4. The Ethernet interface may be used to perform all or some functions of a medium access control (MAC) layer, a reconciliation sublayer (RS), and a physical (PHY) layer. A data transmission method performed by the Ethernet interface may be implemented by a chip or an FPGA.

Figure 3:
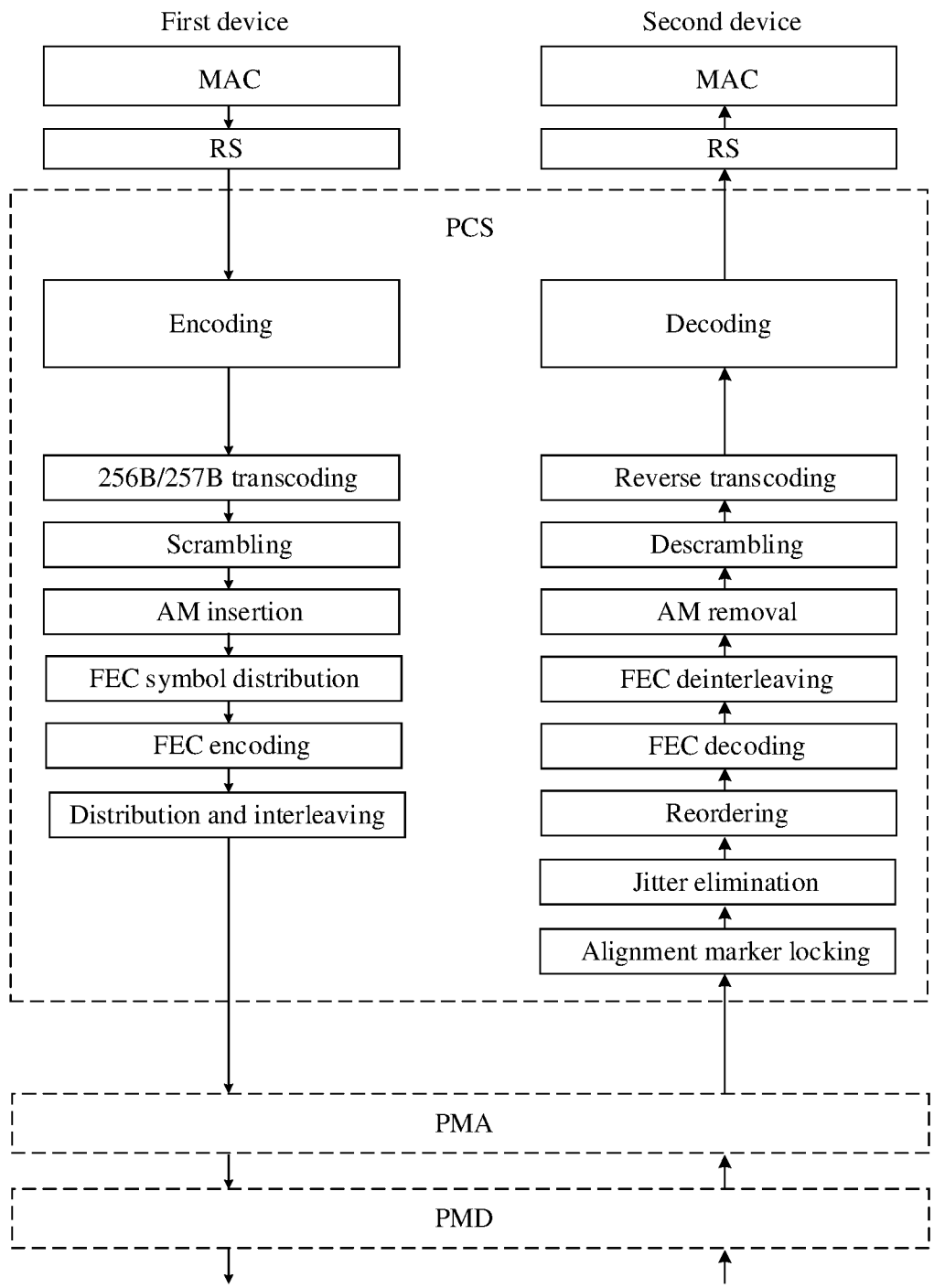
FIG. 3 is a schematic flowchart of an Ethernet data transmission method.

FIG. 3 is a schematic flowchart of an Ethernet data transmission method, which mainly describes related processing processes of a physical layer.

For a first device, after an Ethernet packet enters a medium access control (MAC) layer/reconciliation sublayer (RS), the packet is checked, and encoded according to a requirement of a medium independent interface (MII), and sent to a physical coding sublayer (PCS) through an xMII. The PCS sublayer receives xMII information sent through various MII (generic medium independent interface, xMII) interfaces, and performs code block encoding and rate matching. An xMII is generally applied between a MAC layer and a physical layer of an Ethernet device. In some embodiments, the xMII interface exists in an integrated circuit. The PCS sublayer performs encoding according to a 64-bit (bit, B)/66B rule to form a serial stream. Then the PCS sublayer further encodes a 64B/66B code block into a 257B code block stream according to a 256B/257B encoding rule. After the 257B code block is scrambled, an alignment marker (alignment marker, AM) group is inserted into the 257B code block. The AM group is also a number of 257Bs. After the insertion of the AM group, the 257B code block stream is distributed according to 10 bits per symbol to two lanes for forward error correction (forward error correction, FEC) encoding, and check bits are added. After the FEC encoding, the 257B code block stream is distributed to eight PCSLs according to a rule of 10 bits per symbol. It should be understood that FEC encoding and decoding schemes used for the two lanes of FEC are the same, and encoding and decoding rates and a burst error-resisting capability can be improved by using the two lanes of FEC. Then symbols (10 bits per symbol) are distributed to eight physical coding sublayer lanes (PCSLs) by means of distribution and interleaving. Inserted AMs are distributed on all the PCSLs. The symbols on the PCSLs may be sent to a second device via a physical medium attachment (PMA) sublayer and a physical medium dependent (PMD) sublayer.

The second device receives, via PMD and PMA, the symbols sent by the first device, uses an AM on each PCSL to lock the lane, and reorders the PCS lanes to obtain a symbol stream. After RS decoding is performed on the symbol stream, a serial code block stream is formed, and the AM group in the serial code block stream is removed. After descrambling and reverse transcoding are performed on the serial code block stream from which the AM group has been removed, a 64B/66B serial code block stream is obtained. After decoding and rate compensation are performed on the 64B/66B serial code block stream, data is sent to the RS sublayer and the MAC layer, and the data is transferred to a data link layer by means of the MAC layer.

A bit is a binary digit, which is the smallest unit of measurement of information. A 257B code block stream, a 66B code block stream, and a symbol stream distributed to a logical lane may all be understood as bit streams.

It should be noted that, for ease of understanding, FIG. 3 merely provides a brief description of processing procedures of the Ethernet interface. In specific application, other processing processes may be added, or some of the foregoing processing processes may be omitted. The foregoing method is applicable to 200G and 400G Ethernet interfaces. For 40G and 100G Ethernet interfaces, the processes of FEC encoding, FEC decoding, and 257B transcoding may not be included.

Figure 4:
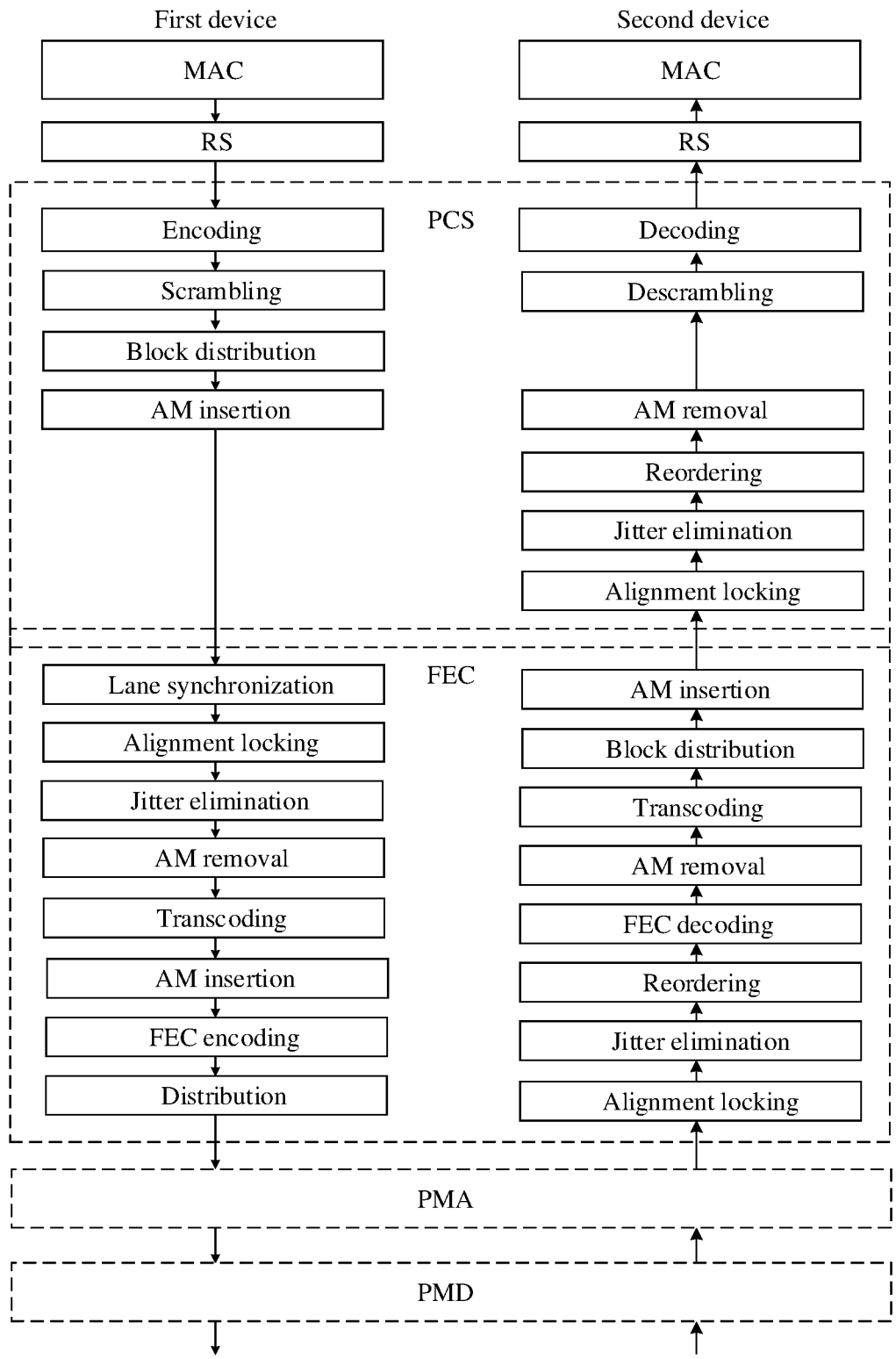
FIG. 4 is a schematic flowchart of another Ethernet data transmission method.

FIG. 4 is a schematic flowchart of an Ethernet data transmission method, which mainly describes related processing processes of a physical layer. The method shown in FIG. 4 is applicable to 40G and 100G Ethernet interfaces.

For a first device, namely, a transmitter, after an Ethernet packet enters a MAC layer/an RS sublayer, the packet is checked, encoded according to a requirement of an xMII, and sent to a PCS sublayer through the xMII. The PCS sublayer encodes the received information through the xMII interface according to a 64B/66B encoding rule, to form a serial 66B code block stream. The 66B code block stream is scrambled and distributed to 20 PCSLs, with AMs for the PCSLs inserted. According to IEEE 802.3, a 100G Ethernet interface includes 20 PCSLs, the 20 PCSLs correspond to 20 AMs, and each AM is sent over one PCSL If FEC encoding is not performed, data on the PCSLs is sent to a second device via PMA and PMD. A PCS sublayer of the second device receives the bit stream sent by the first device over the PCSLs.

The second device locks each PCSL based on the AM in the PCSL, eliminates jitter, and reorders the PCSLs to form a serial stream. Then the AMs are removed, and descrambling is performed. The 66B code block stream is decoded and sent to an MII interface, and a MAC layer/an RS sublayer receives information from the MII interface.

If FEC encoding is performed, after the first device distributes the code block stream to the PCSLs, a FEC sublayer of the first device receives the bit stream sent over the PCSLs. The FEC sublayer may be a sublayer of the physical layer. For ease of understanding, it may be considered that the PCS sublayer includes the FEC sublayer. The AM on each PCSL is used to lock the PCSL, the lanes are reordered to obtain a serial 66B code block stream, and then the AMs in the PCSLs are removed. The 66B code block stream is further encoded into a 257B code block stream according to a 256B/257B encoding rule. Next, an AM group is inserted, where the AM group includes AMs corresponding to forward error correction lanes (FECLs). There is a correspondence between an AM in each FECL and AMs in a plurality of PCSLs. The correspondence is also referred to as a mapping relationship. The AM in each FECL may be determined according to the AMs in the PCSLs. After the AM group is inserted, FEC encoding is performed, and symbols are distributed to a plurality of FECLs, for example, four FECLs for 100G. Data on the FECLs is sent to the second device via PMA and PMD.

The second device, namely, a receiver, receives the transmitted bit stream from the FECLs. The second device locks each lane based on AM information in each FECL to eliminate jitter. After the locked FECLs have been reordered and undergone FEC decoding, a 257B serial stream is formed, and an AM group is removed. The 257B code block stream is transcoded into a 66B code block stream, AMs for PCSLs are inserted, and symbols are distributed to the PCSLs. There is a correspondence between an AM in a PCSL and an AM in a FECL. An AM that corresponds to each PCSL and that is inserted by the second device is the same as an AM that corresponds to the PCSL and that is inserted by the first device.

The PCS sublayer of the second device receives the bit stream sent by the FEC sublayer over the PCSLs.

The second device locks each FECL based on the AM in the FECL, eliminates jitter, and reorders the FECLs to form a serial stream. Then the AMs in the PCSLs are removed, and descrambling is performed. The 66B code block stream is decoded and sent to an xMII interface. A MAC layer/an RS sublayer receives information from the xMII interface, completes checking and related processing, and then restores the Ethernet packet.

It should be understood that FIG. 4 merely provides a brief description of processing procedures of the Ethernet interface.

AM group: The AM group may be a plurality of code blocks. For example, for a 200G Ethernet interface, the AM group is four 257Bs, and the four 257Bs consist of eight 120 bits, a 65-bit padding field, and a 3-bit status field (4*257=120*8+65+3). For another example, for a 400G Ethernet interface, the AM group consists of eight 257Bs, and the eight 257Bs consist of sixteen 120 bits, a 133-bit padding field, and a 3-bit status field (8*257=120*16+133+3). For still another example, for a 100G Ethernet interface, the AM group consists of five 257Bs, and the five 257Bs consist of twenty 64 bits and a 5-bit padding field (5*257=20*64+5).

Logical lane: The logical lane in this application may be a physical coding sublayer lane (PCSL), or a forward error correction lane (FECL), or a lane that is deployed in a 200G, 400G, and higher-speed Ethernet interface and that performs FEC encoding/decoding and symbol distribution independently. In other words, the serial bit stream is distributed according to symbols to at least one lane for FEC encoding, and distributed according to symbols to a group of FEC lanes, where the at least one lane of FEC may be considered as one logical lane. The same is true for the receiving direction. Referring to the processing procedures in FIG. 3, the two lanes of FEC encoding in the first device may be one logical lane. The two lanes of FEC decoding in the second device may be one logical lane. For the 200G/400G Ethernet interface, the PCSL may also be referred to as a FEC lane (FECL). A logical lane is usually visible within a chip, that is, starts or terminates within an integrated circuit.

An attachment unit interface (AUI) may be referred to as a physical lane. The physical lane is deployed between chips, or between a chip and an optical module.

It should be understood that the logical lane and the physical lane are actually different paths in a transmission process, and may also be understood as different layers in a transmission process (for example, the physical lane may be considered as a service layer of the logical lane). A correspondence between a physical lane and a logical lane may be that a logical lanes correspond to b physical lanes, where a=b*c, or b=a*c, and a, b, and c are positive integers. For the 200G, 400G, and higher-speed Ethernet interfaces, a plurality of lanes that independently perform FEC encoding (at least one encoder) and symbol distribution may also be used. In this case, c physical lanes correspond to one logical lane. For the PCSL or the FECL, the c logical lanes correspond to one physical lane, and the first device distributes the code block stream to the logical lanes according to symbols. If one or more logical lanes correspond to one physical lane, data on the logical lanes may be sent to the corresponding physical lane. The second device receives, over b physical lanes, data sent over b physical lanes of the first device, and then distributes data on one physical lane to the c logical lanes. For example, as shown in FIG. 2, for a 200G Ethernet interface, there may be eight parallel logical lanes PCSLs, and bits on two logical lanes may be distributed to one physical lane. Each logical lane transmits 25G payload data, two logical lanes correspond to one physical lane, and one physical lane transmits 50G payload data.

FEC encoding and decoding: refers to correction of bit errors in a transmission process by using an encoding and decoding technology. The FEC encoding may be, for example, Reed-Solomon (RS) encoding. The RS encoding is performed to further improve correctness of a bit stream in a transmission process. During the RS decoding, an error bit may be corrected based on an inserted check bit. For the RS encoding, it may be considered that some check bits are inserted every a specific number of bits without changing the original code block stream. For the RS decoding, it may be considered that without changing the original code block stream, error bits in a transfer process are computed and restored based on the check bits inserted every the specific number of bits during the RS encoding. The check bits are removed after checking is completed.

FEC encoding and decoding schemes: IEEE 802.3 specifies that the 200G and 400G Ethernet interfaces use an RS(544,514) scheme, and the 100G Ethernet interface may use an RS(544,514) or RS(528,514) scheme. Some manufacturers further use an RS(272,257) scheme. Among these RS schemes, the RS(544,514) scheme has a stronger error correction capability, but introduces a higher latency. The RS(272,257) scheme has a weaker error correction capability, but introduces a lower latency.

IEEE 802.3 specifies a low power management technology, namely, energy-efficient Ethernet (EEE). When no packet is to be sent or received over an entire Ethernet interface, a MAC layer/an RS sublayer sends a low power idle (low power idle, LPI) code block to the PCS sublayer. Some elements in the PCS sublayer, the PMA sublayer, and the PMD sublayer are turned off, and enter a deep sleep mode. The some of the elements that are turned off may be elements that consume relatively high energy, such as a logical lane and a physical lane. The MAC layer receives data and sends an idle code block to the PCS sublayer. When detecting the idle code block, the PCS sublayer immediately wakes up a working element that has been turned off, that is, the working element that has been turned off is powered on.

The Ethernet interface can enter the deep sleep mode only when there is no traffic over the entire Ethernet interface. A higher-speed Ethernet interface has a larger bandwidth and can provide services for more users. Because of the large number of connected users, no traffic over the higher-speed Ethernet interface rarely occurs. Therefore, it is difficult for higher-speed Ethernet to reduce power by using this scheme.

Another way to reduce power consumption is to adjust service traffic from some nodes and links to other nodes and links at layer 2 (L2) or layer 3 (L3). Layer 2 includes the MAC layer, and layer 3 includes an internet protocol (IP) layer, a multi-protocol label switching (MPLS) layer, and the like. For example, for the scenario in FIG. 1, data 1 is sent from the device 110 to the device 140 via the device 120, and data 2 is sent from the device 110 to the device 140 via the device 130. A small amount of data is transmitted in the scenario. During data transmission, a data transmission path of data 1 is switched. After the switching, both data 1 and data 2 are sent from the device 110 to the device 140 via the device 130. A device on the path from the device 110 through the device 120 to the device 140 may enter a deep sleep mode to reduce system power consumption.

This technology requires the deployment of a network manager or controller for configuration, which is a network-level behavior and has greater impact on the system. In addition, because packet transmission rates on the two paths may be different, in order to ensure that no packets are lost and packets are not out of order, in the process of switching, a receiver device needs to be provided with functional modules for buffering and packet reordering. This causes relatively high costs.

In addition, an Ethernet link uses relatively strong FEC at the physical layer. The 200G and 400G Ethernet interfaces specified by IEEE 802.3 use RS(544,514), which introduces a relatively high latency. In some cases, when a FEC scheme with a weak error correction capability or no FEC is used, requirements can be met. Regardless of service scenarios, FEC with a relatively strong capability is used for processing, which introduces a relatively high transmission latency and wastes system resources.

In order to resolve the foregoing problems of a high transmission latency or high power consumption, a working mode of the physical layer may be switched. In order to ensure bit-error-free transmission of data, this application provides an Ethernet data transmission method.

Figure 5:
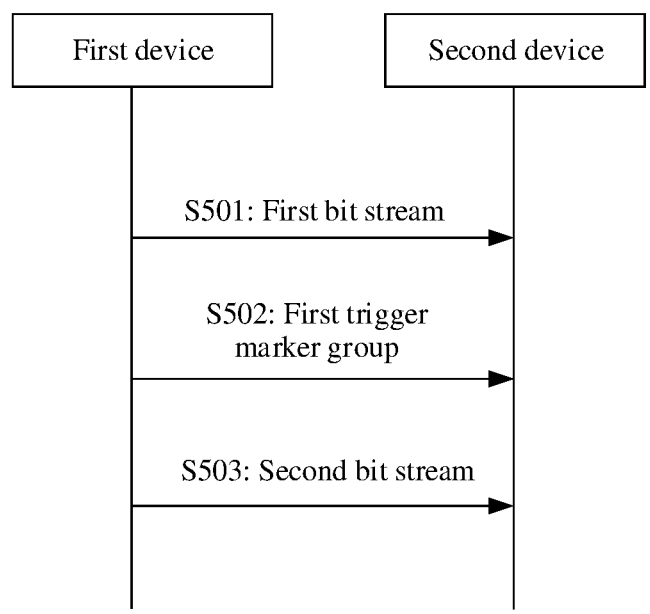
FIG. 5 is a schematic flowchart of an Ethernet data transmission method according to an embodiment of this application.

FIG. 5 is a schematic flowchart of an Ethernet data transmission method according to an embodiment of this application.

At step S501, a first device sends a first bit stream to a second device. The first bit stream is sent over N logical lanes of a physical layer of the first device.

It should be understood that, according to rules of distribution and reordering, the first device distributes a serial bit stream to a plurality of logical lanes according to bit code blocks or symbols, and the second device locks and reorders the plurality of logical lanes, and receives the bit code blocks or symbols, to form a serial bit stream. A sequence of ordering the bit code blocks or symbols in the plurality of logical lanes is relatively fixed. Therefore, it may be considered that the first device sends a bit stream to the second device over the plurality of logical lanes.

Optionally, the first bit stream may include logical lane indication information, and the logical lane indication information is used to indicate P logical lanes for sending a second bit stream. Alternatively, a network manager may send the logical lane indication information to the first device and the second device, to indicate the P logical lanes for sending the second bit stream.

The first bit stream may include anchor information, and the anchor information is used to indicate a time at which the sending of the first bit stream ends. It may also be understood that the anchor information is used to indicate a position of a first trigger marker group in the bit stream. The anchor information may be, for example, an anchor code block. The anchor information may alternatively correspond to a plurality of code blocks. The anchor information may alternatively be represented by an anchor packet. Refer to the description of FIG. 21 and FIG. 22.

The second device receives the anchor code block. After receiving the anchor code block, the second device may remove the anchor code block. The second device may remove the anchor code block from the serial bit stream formed after the logical lanes are reordered.

The second device may detect a trigger marker based on the anchor code block. The second device may monitor the logical lanes and detect the trigger marker in the plurality of logical lanes. Alternatively, the second device may detect the trigger marker in the serial bit stream formed after the logical lanes are reordered.

The second device may remove the trigger marker from the serial bit stream. The removal of the trigger marker may also be referred to as the extraction of the trigger marker. The removal of the trigger marker can reduce the interference to data transmission.

With only one anchor code block, the first device and the second device can configure the switching of a working mode, thereby reducing system overheads.

Optionally, the anchor code block may include physical layer switching information, and the physical layer switching information is used to identify that the code block is used for switching a working mode of a physical layer.

Optionally, the anchor code block may include an anchor code block identifier, and the anchor code block identifier is used to indicate that the code block is an anchor code block.

Optionally, the anchor code block may include trigger indication information, and the trigger indication information is used to indicate a position of a trigger marker group in the bit stream.

Optionally, the anchor code block may include first switching mode indication information, and the first switching mode indication information is used to indicate a switching mode. The switching mode includes transmission rate related switching and/or transmission latency related switching. For the transmission rate related switching, before and after the switching, different numbers of logical lanes are used to send the bit stream. For the transmission latency related switching, before and after the switching, different FEC encoding schemes (including no FEC encoding) are used to obtain the bit stream.

In some embodiments, after receiving the anchor code block, the second device may send a response code block to the first device. The response code block is used to indicate the sending of the first trigger marker group. In other words, based on the response code block, the first device sends the first trigger marker group to the second device.

The physical layer of the first device may include a transmitting logical lane and a receiving logical lane. The transmitting logical lane may be used to send a bit stream to the second device. The receiving logical lane may be used to receive a bit stream sent by the second device. The transmitting logical lane and the receiving logical lane of the first device may run at the same time.

The first device may receive, over the receiving logical lane, response information sent by the second device. The response information may be, for example, an anchor code block, or use the same type as the anchor code block. In other words, the response information may be a response code block. The response code block may include an identifier of the response information. For example, a field in the response code block that corresponds to an identifier of the anchor code block is used to identify that the code block is a "response" code block.

Optionally, the response code block may include second switching mode indication information. The first device may determine the switching mode based on the second switching mode indication information in the response code block.

For example, the anchor code block includes the first switching mode indication information, and the first switching mode indication information indicates that the switching mode is rate reduction and latency reduction. The response code block includes the second switching mode indication information, and the second switching mode indication information indicates that the switching mode is latency reduction with a transmission rate unchanged. Based on the second switching mode indication information in the response code block, the first device determines that the switching mode is latency reduction with the transmission rate unchanged. The second device may determine the second switching mode indication information based on an available switching mode.

Optionally, the response code block may include the physical layer switching information, and the physical layer switching information is used to identify that the code block is used for switching a working mode of a physical layer.

If the first device does not receive the response code block, the first device does not stop sending the first bit stream, and no longer performs steps S502 and S503. If the first device receives the response code block, steps S502 and S503 are performed.

Determining the switching of the working mode by receiving the response code block can improve the reliability of the switching procedure. If the second device does not support the switching of the working mode of the physical layer, and only the first device performs the switching, a data reception error may be caused. When the second device supports the switching of the working mode of the physical layer, the second device sends the response code block to the first device, so that the reliability of the switching procedure can be improved, thereby avoiding data loss. The response code block may further include the second switching mode indication information, and the second switching mode indication information may indicate a type of a switching mode supported by the second device. This further improves the reliability of the switching procedure.

Certainly, the first device may alternatively determine, by means of information sent by a gateway, that the second device supports the switching of the working mode of the physical layer.

In other embodiments, the first bit stream does not include an anchor code block. In this case, the first device and the second device may determine the switching mode through configuration by the network manager.

At step S502, the first device sends a first trigger marker group to the second device, where the first trigger marker group is used to indicate that the sending of the first bit stream ends.

The first trigger marker group may be a flag for switching between two different working modes.

The first trigger marker group may be sent in the same manner as the first bit stream or the second bit stream.

The first trigger marker group includes trigger markers corresponding to the foregoing N logical lanes or P logical lanes.

When the first bit stream includes the anchor code block, for a round of AM sending, an AM corresponding to each logical lane may be used as a trigger marker corresponding to the logical lane. The first trigger marker group includes AMs corresponding to the foregoing N or P logical lanes.

In this embodiment of this application, a form of the trigger marker group is not limited, and the trigger marker group may be one or more 257B code blocks, or one or more 66B code blocks, or in other forms. The first trigger marker group may reuse an AM group, that is, the first trigger marker group may be an AM group. Alternatively, in a 100G Ethernet interface, when FEC is not performed, the first trigger marker group may include one or more 66B code blocks, and the one or more 66B code blocks correspond to AMs in N or P PCSLs.

The first device may insert the trigger marker group into a serial first bit stream before the first bit stream is distributed to the N logical lanes. Alternatively, the first device may insert each trigger marker in the first trigger marker group into a logical lane corresponding to the trigger marker in the process of distributing the first bit stream.

The second device receives the first trigger marker group. The second device may detect the trigger marker corresponding to each logical lane. After detecting the trigger marker, the second device may remove the trigger marker from the bit stream. When the trigger marker is the AM in the logical lane, the process of removing the AM is the removal of the trigger marker.

At step S503, the first device sends the second bit stream to the second device in response to the sending of the first trigger marker group. The second bit stream is sent over the P logical lanes of the physical layer of the first device, where N and P are both positive integers.

The first trigger marker group may include N trigger markers, and the first device may send an $i^{th}$ trigger marker in the N trigger markers over an $i^{th}$ logical lane in the N logical lanes.

Alternatively, the first trigger marker group may include P trigger markers, and the first device may send an $i^{th}$ trigger marker in the P trigger markers over an $i^{th}$ logical lane in the P logical lanes. The P logical lanes for sending the P trigger markers are the same as the P logical lanes for sending the second bit stream by the first device.

In response to the receiving of the first trigger marker group, the second device receives the second bit stream sent by the first device.

A trigger marker sent over each logical lane may be the same or different. For example, the $i^{th}$ trigger marker may include information for identifying the $i^{th}$ logical lane.

N and P may be the same or different. In other words, the first bit stream and the second bit stream may be sent over the same or different numbers of logical lanes. In some embodiments, the first bit stream and the second bit stream may be sent over the same logical lane.

Sending the first bit stream and the second bit stream over different numbers of logical lanes can change a transmission rate of a bit stream, that is, the transmission rate related switching can be performed. If N is greater than P, after the first trigger marker group is sent, the number of physical layer logical lanes for sending a bit stream is reduced, system power consumption is reduced, and a transmission rate of the bit stream is reduced. If N is less than P, after the first trigger marker group is sent, the number of physical layer logical lanes for sending a bit stream is increased, system power consumption is increased, and a transmission rate of the bit stream is increased.

A physical layer logical lane that does not perform bit stream transmission may quit running. The logical lane quitting running means that the logical lane stops sending a bit stream, that is, a physical component corresponding to the logical lane quits running. One physical lane corresponds to one or more logical lanes. When some logical lanes stop sending a bit stream, some physical lanes may stop sending a bit stream, thereby further reducing system power consumption. Therefore, when logical lanes are controlled to quit running, a lane corresponding to these logical lanes may be controlled to quit running. In other words, this can make more physical lanes quit running, thereby reducing system power consumption.

By means of steps S501 to S503, the transmission latency related switching may also be performed.

Different FEC encoding schemes correspond to different error correction capabilities. The use of FEC encoding introduces a latency. A FEC encoding scheme with a stronger error correction capability used for encoding introduces a higher latency.

Optionally, the first bit stream may be encoded by using a first FEC encoding scheme, and the second bit stream may be encoded by using a second FEC encoding scheme, where the first FEC encoding scheme may be different from the second FEC encoding scheme. Different FEC encoding schemes correspond to different error correction capabilities, that is, an error correction capability of the second FEC encoding scheme is different from that of the first FEC encoding scheme.

The second device receives the first bit stream. The second device decodes the first bit stream by using a first FEC decoding scheme corresponding to the first FEC encoding scheme.

The second device receives the second bit stream. The second device decodes the second bit stream by using a second FEC decoding scheme corresponding to the second FEC encoding scheme.

Optionally, one of the first bit stream and the second bit stream is encoded by using FEC. In other words, one of the first bit stream and the second bit stream has undergone FEC encoding, and the other has not undergone FEC encoding. The second device performs FEC decoding on the bit stream encoded by using forward error correction FEC.

It should be understood that a data processing process is almost unchanged before and after the switching. For example, for the Ethernet data transmission method shown in FIG. 4, for the transmission latency related switching, at any time before and after the switching, even if the bit stream has not undergone FEC encoding and decoding, the bit stream still needs to be transmitted over a FECL. In other words, only the encoding and decoding schemes in the FEC encoding and decoding processes change, and other processing processes remain unchanged.

By means of steps S501 to S503, bit-error-free data transmission when the working mode of the physical layer is switched can be achieved.

The first device may agree with the second device on the switching of the working mode and a time point of the switching by means of the anchor code block. The time point of the switching may be understood as a position in the bit stream.

The first device may send the trigger marker group, to indicate the second device to perform switching, thereby ensuring that there is no bit error. The sending of the trigger marker group by the first device may be used as a start point of a new working mode or an end point of an original working mode. The receiving of the trigger marker group by the second device may be used as a start point of a new working mode or an end point of an original working mode. In other words, the trigger marker group may be used as the start point of the new working mode, or the end point of the original working mode.

The switching of the working mode may be some logical lanes quitting or resuming running, or may be changing a FEC scheme, or may be a combination of these two manners, or switching of other physical layer working modes. Changing the FEC scheme may include switching related to whether to perform FEC and switching related to FEC encoding and decoding schemes.

In the foregoing manner, the bit-error-free switching of the physical layer is achieved, and service transmission is not affected. In addition, there is no need to provide a large buffer and a packet reordering module, which reduces system costs. This is compatible with an existing IEEE 802.3 architecture and is simple to operate and easy to implement.

FIG. 6 is a schematic diagram of types of 64B/66B code blocks specified by IEEE 802.3.

In 64B/66B encoding, 64-bit data or control information is encoded into a 66-bit block for transmission. The first two bits of the 66-bit block represent a synchronization header, and the last 64 bits may be referred to as a data payload. There are two types of synchronization headers, "01" and "10". In a data code block, a synchronization header is "01", and 64 bits following the synchronization header are all data. In a control code block, a synchronization header is "10", and 64 bits following the synchronization header include data and/or control information. In the control code block, the first 8 bits in the data payload, that is, the 8 bits adjacent to the synchronization header, are a type field, which may indicate a type of the control code block. The last 56 bits in the data payload, that is, the 56 bits following the type field are control information and/or data. In a 64B/66B code block, D represents a data byte, and each data byte has 8 bits; C represents a control byte, and each control byte has 7 bits; S represents the start of a data packet, and T represents the end of the data packet; and O represents an ordered set control code block (for example, for type 0x4B, a different value of O indicates a different use scenario). S occurs only in byte 0 and byte 4 of the eight bytes, and T can occur in any byte. A code block containing S may be referred to as an S code block, and a code block containing T may be referred to as a T code block. $C_0$ to $C_7$ in an idle (IDLE) code block are 0, and $C_0$ to $C_7$ in a low power idle (LPI) block code are 6.

The anchor code block may be a 64B/66B control code block. For example, a control code block as the anchor code block may be of type 0x4B, 0x2D, 0x55, 0x00, or the like.

The response code block may be a 64B/66B control code block. For example, a control code block as the response code block may be of type 0x4B, 0x2D, 0x55, 0x00, or the like.

In a case of distribution according to 66B symbols, a trigger marker sent to each logical lane may be a 64B/66B control code block. For example, a control code block as the trigger marker may be of type 0x4B, 0x2D, 0x55, 0x00, or the like. A trigger marker may also reuse an AM.

The following description is based on a control code block of type 0x4B. Information in the control code block of type 0x4B may be used to indicate that the code block is an anchor code block, a response code block, or a trigger marker.

Figure 7:
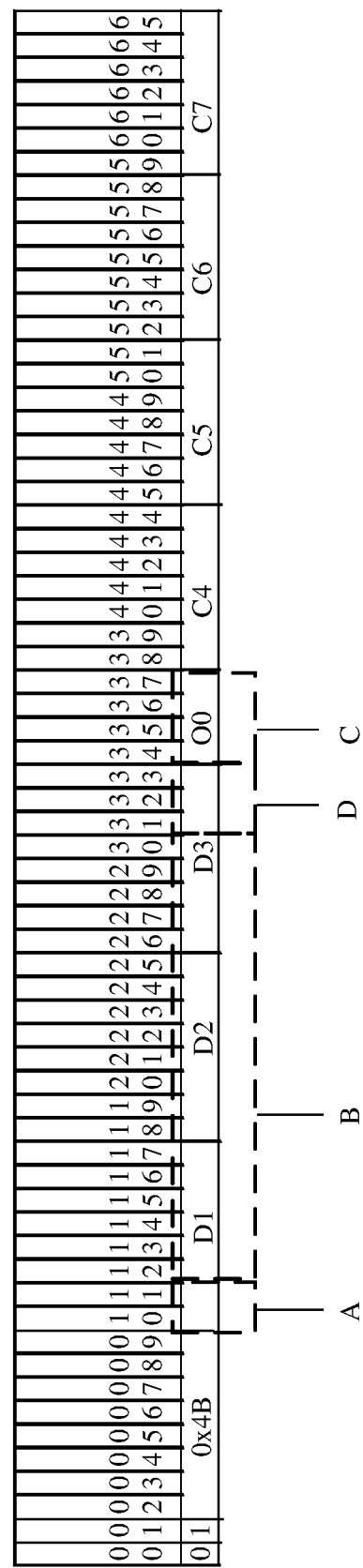
FIG. 7 is a schematic diagram of a control code block of type 0x4B.

FIG. 7 is a schematic diagram of a control code block of type 0x4B.

In the control code block of type 0x4B, A, B, C, and D each are several bits in the control code block. The type of the code block may be indicated by the A field of 2 bits. For example, when the A field is "01", it indicates that the code block is an anchor code block; when the A field is "11", it indicates that the code block is a response code block. If the trigger marker is a 66B code block, when the A field is "10", it indicates that the code block is a trigger marker.

When an identifier of the A field is "01", that is, the code block is an anchor code block, the B field may be used to identify a position of the trigger marker in a code block stream. For example, the B field may be used to identify the number of code blocks between the trigger marker group and the anchor code block, or the number of AM groups between the trigger marker group and the anchor code block.

The C field may reuse an O0 field. According to IEEE 802.3, O0 is a reserved field, which may be referred to as a sequence ordered set (sequence ordered set). The 4 bits of the C field may be used to identify a fault. For example, when the C field is "0000", it indicates normal; when the C field is "0001", it indicates a local fault; and when the C field is "0010", it indicates a remote fault. Other values of the C field, such as "0100" or "1010", may be used to indicate that the code block is a code block for indicating switching of a working mode of a physical layer. The prefix "0x" refers to a hexadecimal code. For example, "1010" may be marked as "oxa".

The D field may include 3 bits, which may be used to indicate a switching type. When the code block is an anchor code block, 2 bits in the D field may be used to indicate transmission rate related switching, and the other 2 bits may indicate transmission latency related switching. That is, the D field may be the first switching mode indication information. For example, the D field "0001" may indicate rate increasing, "0010" for rate reduction, "0100" for latency increasing, "1000" for latency reduction, and so on. In other words, the D field may be used to identify a case in which both the transmission rate related switching and the transmission latency related switching are performed.

When the A field is "11", that is, the code block is a response code block, the C field may be used to indicate that the code block is a code block for indicating switching of a working mode of a physical layer. The D field may be used to indicate a switching type, that is, the D field may be the second switching mode indication information.

When the A field is "10", that is, a trigger marker, the B field may be used to indicate logical lanes corresponding to the trigger marker group.

According to IEEE 802.3, the first device periodically sends AMs over each PCSL or FECL, and the second device periodically receives the AMs over each PCSL or FECL. The AMs are sent and received periodically over each lane, and AMs of different logical lanes carry information identifying the corresponding logical lanes. Therefore, the trigger marker group may reuse the AMs. In this case, the B field in the anchor code block may indicate that after the first device inserts the anchor code block, AMs sent in an $M^{th}$ period are the trigger marker group. In other words, for the second device, the B field in the anchor code block may indicate that in a serial bit stream, the AMs in the $M^{th}$ period following the anchor code block are the trigger marker group.

Figure 8:
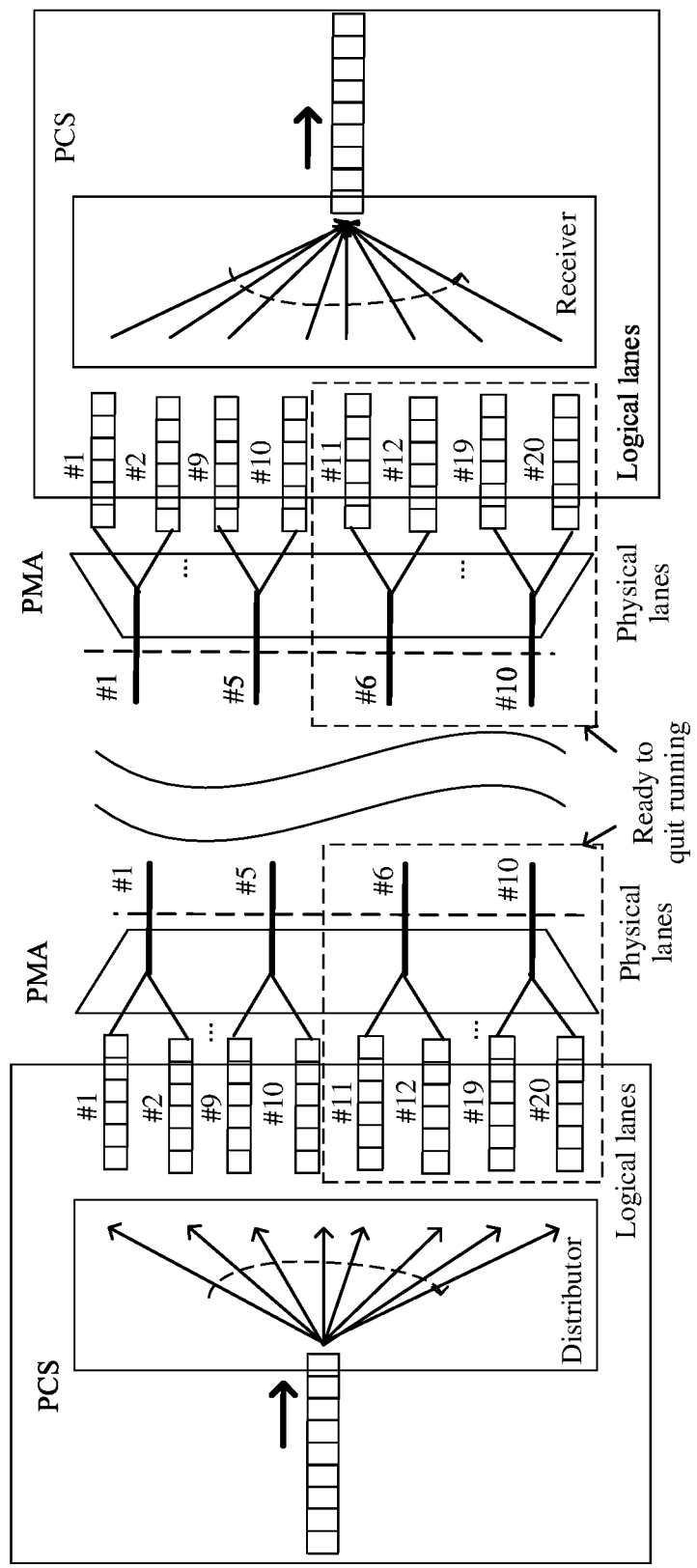
FIG. 8 is a schematic flowchart of an Ethernet data transmission method according to another embodiment of this application.

FIG. 8 is a schematic flowchart of an Ethernet data transmission method according to an embodiment of this application.

For a 100G Ethernet interface, 10×10 Gbps physical lanes may be electrically interconnected, and FEC may not be performed. According to IEEE 802.3, the 100G Ethernet interface corresponds to 20 PCS lanes. A PCSL is a logical lane. Logical lanes #1 and #2 correspond to physical lane #1, logical lanes #3 and #4 correspond to physical lane #2, and a correspondence between other logical lanes and physical lanes can be deduced by analogy. Logical lane #1 means that an index of the logical lane is 1. A bit stream sent over each PCS lane is in the form of 66B code blocks. When traffic on a link is much less than 50 G, a network manager may deliver logical lane indication information to indicate that PCS lanes #11 to #20 of the link are to be bypassed, that is, PCS lanes #11 to #20 are no longer used to transmit data, and these PCS lanes may enter a deep sleep mode. For example, these logical lanes and corresponding physical lanes may be turned off. Logical lane indexes of the 20 PCS lanes corresponding to the Ethernet interface are #1 to #20. In this case, it is required to bypass #11 to #20, that is, logical lanes #11 to #20 quit running, and the corresponding physical lanes are #6 to #10.

Figure 9:
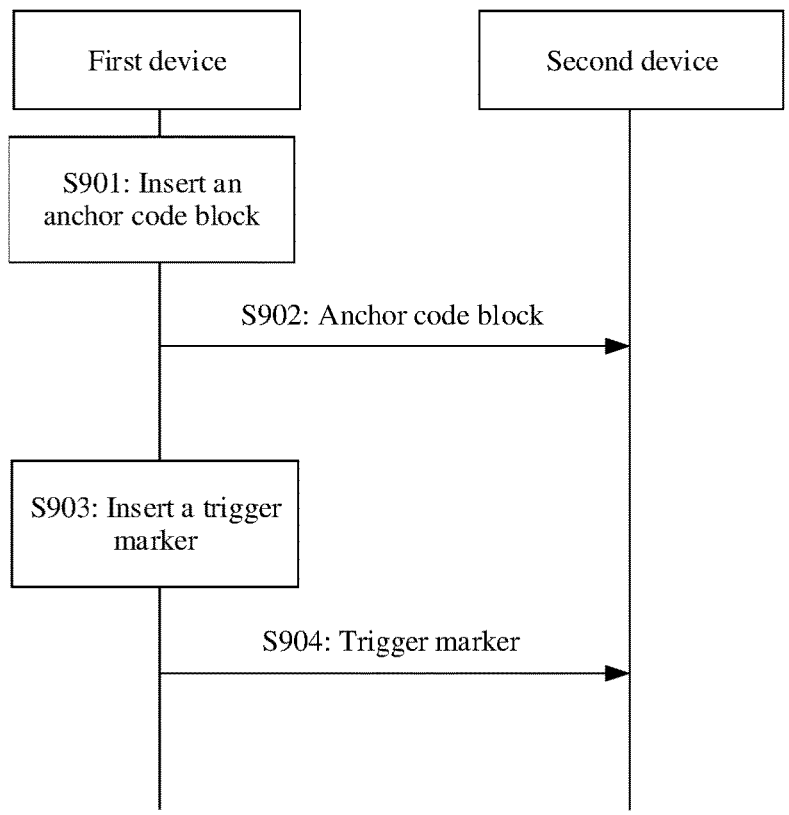
FIG. 9 is a schematic flowchart of an Ethernet data transmission method according to still another embodiment of this application.

The first device initiates switching, and the second device cooperates. Each trigger marker in a trigger marker group may be a control code block shown in FIG. 7. Refer to FIG. 9 for a specific switching process.

FIG. 9 is a schematic flowchart of an Ethernet data transmission method according to an embodiment of this application. A logical lane is a PCSL.

Step S901: A first device inserts an anchor code block.

Figure 10A:
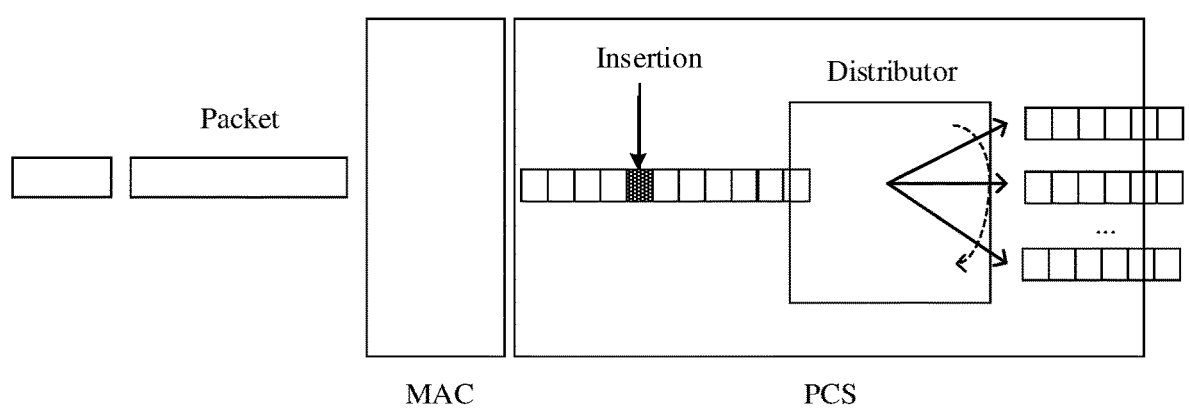
FIG. 10a to FIG. 10d are schematic diagrams of Ethernet data transmission according to another embodiment of this application.

Referring to FIG. 10a, a MAC layer of the first device receives a data packet. The first device inserts the anchor code block into a serial bit stream in a PCS sublayer. A code block shaded in the figure is the anchor code block.

To facilitate determining of a position of a trigger marker group, the anchor code block may be inserted at a position of an integer multiple after the first code block corresponding to an AM in the bit stream. The first device detects an AM code block in a PCS lane, and an integer multiple of N with the AM is maintained. N is the number of working lanes in the current mode. For example, if N is 20, the anchor code block is inserted at a position with a distance of 50×20 code blocks from the AM code block, that is, the $(50×20)^{th}$ code block after the AM is the anchor code block. With reference to the format of the anchor code block shown in FIG. 7, the B field may be set to M in the anchor code block. M is used to indicate a position of the trigger marker group. For example, M may indicate that in the bit stream, an $M^{th}$ code block after the anchor code block is the first code block of the trigger marker group. For example, the trigger marker group starts from the $M^{th}$ code block after the anchor code block. The value of M may be determined by the first device or configured by a network manager. For example, M=10240. When the anchor code block is inserted, the first device starts M counting, to count the number of code blocks sent after the anchor code block is inserted. The anchor code block may include switching type information. The switching type information "0x2" may indicate that a mode switching type is rate reduction.

After step S901, the first device sends the anchor code block to the second device. According to a distribution rule of an Ethernet interface, the anchor code block is distributed to a logical lane. The first device sends a bit stream to the second device. The anchor code block inserted into a serial bit stream is sent to the second device along with the bit stream.

At step S902, the second device receives the anchor code block.

Figure 10B:
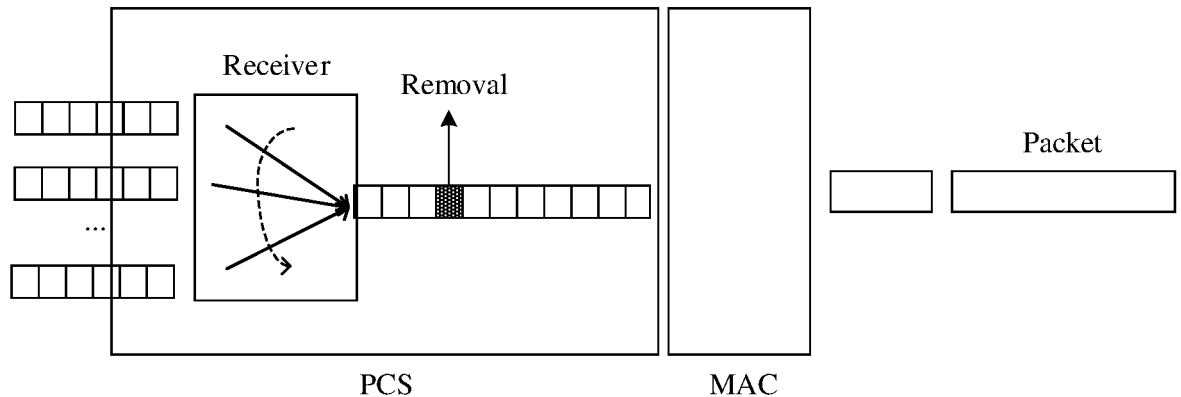

Referring to FIG. 10b, the second device removes the anchor code block from the serial bit stream. A code block shaded in the figure is the anchor code block.

According to the anchor code block, the second device obtains information of M=10240, and starts M counting, to count the number of code blocks received after the anchor code block is received.

The second device may send response information to the first device, and the response information may be, for example, a response code block. The second device may send the response code block to the first device over a transmitting logical lane of the second device. The transmitting logical lane of the second device is used to send a bit stream to the first device.

If the first device does not receive the response code block when counting to M, switching a working mode of a physical layer is skipped, that is, steps S903 and S904 are not performed.

If the first device receives the response code block before counting to M, step S903 is performed.

At step S903, the first device inserts a trigger marker.

Figure 10C:
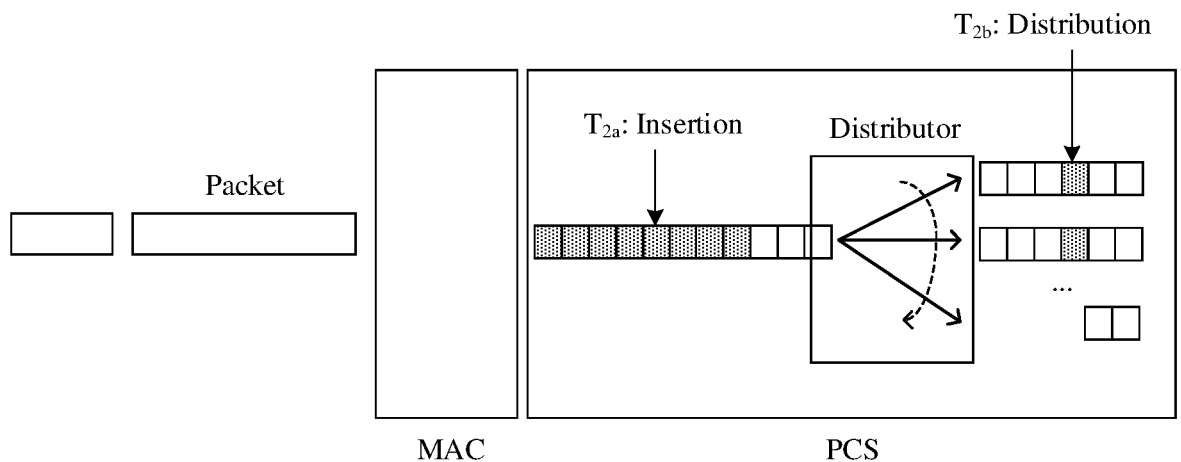

Referring to FIG. 10c, at $T_{2a}$, the first device counts to M and inserts a trigger marker group. The number of trigger markers in the trigger marker group is 10 or 20, which corresponds to 10 logical lanes for bit stream transmission after switching, or corresponds to 20 logical lanes for bit stream transmission before switching. The first device distributes the trigger marker group. At $T_{2b}$, the first device has finished distributing the trigger marker group, and each trigger marker has been distributed to a corresponding logical lane. A shaded part in the figure is a trigger marker. For a 100G Ethernet interface, a serial bit stream is distributed to logical lanes according to 66B code blocks, and the number of trigger markers is the number of 66B code blocks occupied by the trigger markers.

The first device may agree with the second device that during transmission rate related switching, the inserted trigger marker group is to be sent over the logical lanes before the switching or over the logical lanes after the switching. To be specific, the first device may agree with the second device that the trigger marker group is to be distributed over logical lanes #1 to #10 or over logical lanes #1 to #20.

If the first device inserts a trigger marker group corresponding to the 10 logical lanes #1 to #10, 10 is the number of logical lanes (PCS lanes) in a new mode, and a distributor of the first device distributes the trigger marker group to logical lanes #1 to #10, while logical lanes #11 to #20 quit running. The distributor may be considered as an apparatus in the first device that distributes the serial bit stream to the logical lanes.

If the first device inserts a trigger marker group corresponding to the 20 logical lanes #1 to #20, 20 is the number of logical lanes (PCS lanes) in an original mode, and the distributor distributes the trigger marker group to logical lanes #1 to #20, and then logical lanes #1 to #20 quit running. The trigger marker group is a demarcation point for the distributor of the first device to work in the old and new modes, and is a start point of the new mode.

Because a distance between the anchor code block and the first AM code block is 50×20, a distance between the first code block corresponding to the trigger marker group and the anchor code block is 10240. 10240+1000 is an integer multiple (452 times) of 20. A bit stream sent over each PCS lane is 64B/66B code blocks, and therefore each trigger marker in the trigger marker group is to be sent to a desired logical lane.

According to a distribution rule of an Ethernet interface, the trigger marker is distributed to a logical lane. The first device sends a bit stream to the second device. The trigger marker is sent to the second device.

At step S904, the second device receives the trigger marker when the counting is about to reach M.

Figure 10D:
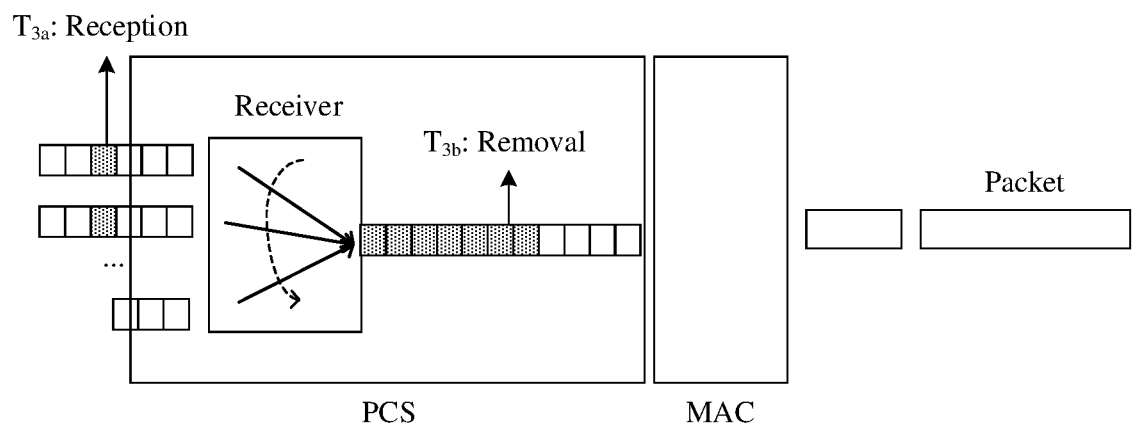

If the first device inserts the trigger marker group corresponding to logical lanes #1 to #10, the second device detects a trigger marker corresponding to each lane on the corresponding logical lanes #1 to #10. Alternatively, as shown in FIG. 10d, the second device detects the trigger marker group after logical lanes #1 to #10 are locked and reordered to form a serial stream. In FIG. 10d, symbols corresponding to the trigger markers in the logical lanes and code blocks corresponding to the trigger markers in the serial bit stream are shaded. In the serial bit stream, the second device removes the trigger markers and completes the extraction of the trigger markers.

If the first device inserts the trigger marker group corresponding to logical lanes #1 to #20, the second device detects a trigger marker corresponding to each lane on logical lanes #1 to #20. Alternatively, the trigger marker group is detected after the logical lanes are locked and reordered to form a serial stream. Then, a receiver of the second device no longer receives any symbols from logical lanes #1 to #20. The receiver may be considered as an apparatus in the second device that receives and orders bit code blocks or symbols in the logical lanes.

It may be considered that after the second device receives the trigger markers from the logical lanes, there is no useful information on logical lanes #11 to #20, but there may be a pseudo-random binary sequence (pseudo-random binary sequence, PRBS) inserted by the first device or other interference. The second device switches to a new working mode. In other words, after receiving the trigger markers, the second device receives symbols only from logical lanes #1 to #10. The trigger marker group is a demarcation point for the receiver of the second device to work in the old and new modes, and is a start point of the new mode.

Referring to FIG. 10d, at $T_{3a}$, a PCS sublayer of the second device may receive the trigger markers. At $T_{3a}$, the logical lanes have been locked, and the PCS sublayer of the second device may detect and remove the trigger marker group in a serial bit stream.

Alternatively, at $T_{3a}$, the PCS sublayer of the second device may receive and detect the trigger markers corresponding to the logical lanes on the plurality of logical lanes. The detection of the trigger markers may be understood as identification of the trigger markers. At $T_{3b}$, when the logical lanes are reordered to form a serial bit stream, the serial bit stream includes the trigger markers, and the trigger markers are removed.

On a 100G Ethernet link, the first device sends an anchor code block to notify the second device that logical lanes #11 to #20 exit data transmission between the first device and the second device immediately after 10240 code blocks. When the first device counts to 10240, the first device inserts a trigger marker group corresponding to logical lanes #1 to #10, and stops sending data on logical lanes #11 to #20. Trigger markers in the trigger marker group are used to guide the second device to complete rate reduction switching.

By means of the foregoing solution, synchronous switching between the first device and the second device can be completed based on code blocks of the PCS sublayer, a higher-rate mode is switched to a lower-rate mode, the second device has no code block or bit errors, and no buffer or packet reordering module is required, which is simple and efficient.

Alternatively, an AM sent over each FECL at a time may be used as a trigger marker. The first device sends the anchor code block and the trigger marker, and the second device receives the anchor code block and the trigger marker, to complete physical layer switching.

Table 1 shows an AM specification for a 100G Ethernet PCSL in IEEE 802.3. A 100G Ethernet interface includes 20 PCSLS. In an AM, a bit-interleaved parity (BIP) byte is used for bit error checking, and M bytes ($M_1$ to $M_6$) are used for identification of logical lanes and logical lane alignment.

TABLE 1

| PCSL index | AM $\{M_0, M_1, M_2, BIP_3, M_4, M_5, M_6, BIP_7\}$ |
|---|---|
| 0  | 0xCl, 0x68, $0x_{21}$, $BIP_3$, $0x_3E$, $0x_{97}$, 0xDE, $BIP_7$ |
| 1  | $0x_9D$, $0x_{71}$, 0x8E, $BIP_3$, $0x_{62}$, 0x8E, $0x_{71}$, $BIP_7$ |
| 2  | $0x_9D$, $0x_4B$, 0xE8, $BIP_3$, 0xA6, $0xB_4$, $0x_{17}$, $BIP_7$ |
| 3  | $0x_4D$, $0x_{95}$, $0x_7B$, $BIP_3$, $0xB_2$, 0x6A, $0x8_4$, $BIP_7$ |
| 4  | $0xF_5$, $0x_{07}$, $0x_{09}$, $BIP_3$, $0x_0A$, 0xF8, 0xF6, $BIP_7$ |
| 5  | 0xDD, $0x_{14}$, $0xC_2$, $BIP_3$, $0x_{22}$, 0xEB, $0x_3D$, $BIP_7$ |
| 6  | $0x_9A$, $0x_4A$, $0x_{26}$, $BIP_3$, $0x_{65}$, $0xB_5$, $0xD_9$, $BIP_7$ |
| 7  | $0x_7B$, $0x_{45}$, 0x66, $BIP_3$, $0x8_4$, 0xBA, $0x_{99}$, $BIP_7$ |
| 8  | 0xA0, $0x_{24}$, $0x_{76}$, $BIP_3$, $0x_5F$, 0xDB, $0x8_9$, $BIP_7$ |
| 9  | 0x68, $0xC_9$, 0xFB, $BIP_3$, $0x_{97}$, $0x_{36}$, $0x_{04}$, $BIP_7$ |
| 10 | 0xFD, 0x6C, $0x_{99}$, $BIP_3$, $0x_{02}$, $0x_{93}$, 0x66, $BIP_7$ |
| 11 | $0xB_9$, $0x_{91}$, $0x_{55}$, $BIP_3$, $0x_{46}$, 0x6E, 0xAA, $BIP_7$ |
| 12 | $0x_5C$, $0xB_9$, $0xB_2$, $BIP_3$, $0xA_3$, $0x_{46}$, $0x_4D$, $BIP_7$ |
| 13 | 0x1A, 0xF8, 0xBD, $BIP_3$, $0xE_5$, $0x_{07}$, $0x_{42}$, $BIP_7$ |
| 14 | $0x8_3$, $0xC_7$, 0xCA, $BIP_3$, $0x_7C$, $0x_{38}$, $0x_{35}$, $BIP_7$ |
| 15 | $0x_{35}$, $0x_{36}$, 0xCD, $BIP_3$, 0xCA, $0xC_9$, $0x_{32}$, $BIP_7$ |
| 16 | $0xC_4$, $0x_{31}$, $0x_4C$, $BIP_3$, $0x_3B$, 0xCE, $0xB_3$, $BIP_7$ |
| 17 | 0xAD, 0xD6, $0xB_7$, $BIP_3$, $0x_{52}$, $0x_{29}$, $0x_{48}$, $BIP_7$ |
| 18 | $0x_5F$, 0x66, $0x_2A$, $BIP_3$, 0xA0, $0x_{99}$, $0xD_5$, $BIP_7$ |
| 19 | 0xC0, 0xF0, $0xE_5$, $BIP_3$, $0x_3F$, $0x_0F$, 0xlA, $BIP_7$ |

Table 2, shown in FIG. 27, shows an AM specification for a 100G Ethernet FECL in IEEE 802.3. The 100G Ethernet interface includes four FECLs. amp_tx_i represents an AM corresponding to a PCSL indexed i. In other words, one FECL corresponds to a plurality of PCSLs. Symbols transmitted over the plurality of PCSLs are transmitted over the FECL. Indexes of a plurality of PCSLs corresponding to a FECL indexed 0 are 0, 4, 8, 12, and 16, respectively.

In a case of FEC for 40G and 100G Ethernet interfaces, there is a correspondence between a PCSL and a FECL, that is, each FECL corresponds to a plurality of PCSLs. A logical lane quitting or starting running means that a FECL and a plurality of PCSLs corresponding to the FECL quit or start running.

For example, for the 100G Ethernet interface, PCSLs #0, #4, #8, and #16 correspond to FECL #0. AMs in PCSLs #0, #4, #8, and #16 correspond to an AM in FECL #0. PCSLs #0, #4, #8, and #16 correspond to FECL #0. Trigger markers in PCSLs #0, #4, #8, and #16 correspond to a trigger marker in FECL #0.

Figure 11:
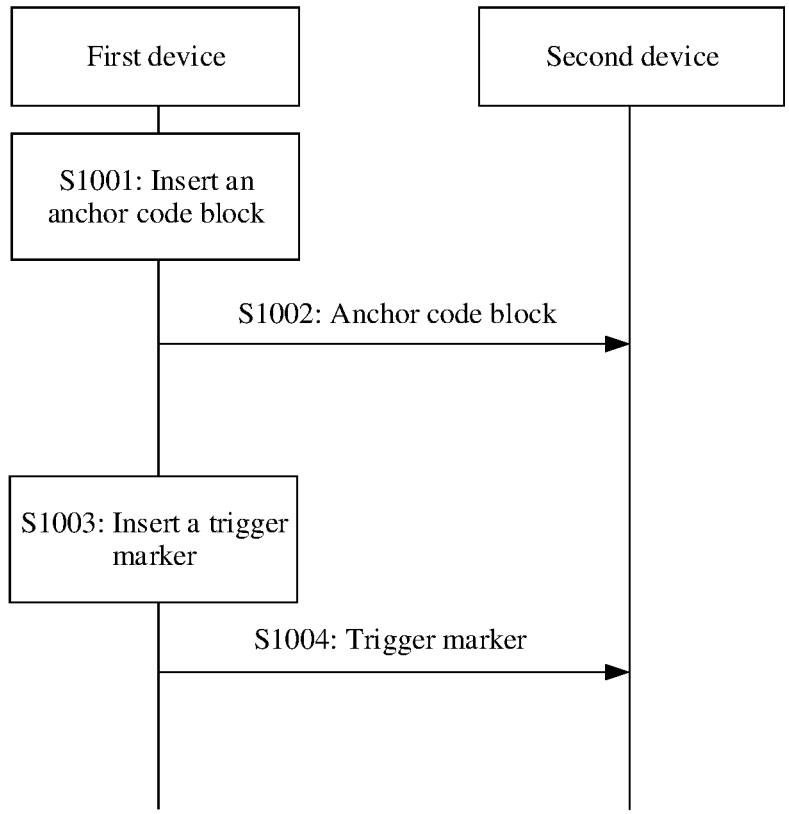
FIG. 11 is a schematic flowchart of an Ethernet data transmission method according to still another embodiment of this application.

FIG. 11 is a schematic flowchart of an Ethernet data transmission method according to an embodiment of this application. A logical lane is a PCSL A 400G Ethernet interface specifies 16 PCSL/FECL logical lanes, and uses 8×50 Gbps physical lanes for electrical interconnection. Each physical lane corresponds to two logical lanes. RS(544,514) is used for an FEC scheme. When traffic on a link is much less than 200 G, a network manager delivers an instruction to request the link to bypass logical lanes #9 to #16. For a correspondence between logical lanes and physical lanes, refer to FIG. 8. Logical lanes #1 and #2 correspond to physical lane #1, logical lanes #3 and #4 correspond to physical lane #2, and a correspondence between other logical lanes and physical lanes can be deduced by analogy. The logical lanes are indexed #1 to #16. In this case, it is required to bypass #9 to #16, that is, logical lanes #9 to #16 quit running, and the corresponding physical lanes are #5 to #8.

An AM group may be reused as a trigger marker group.

At step S1001, a first device inserts an anchor code block.

Figure 12A:
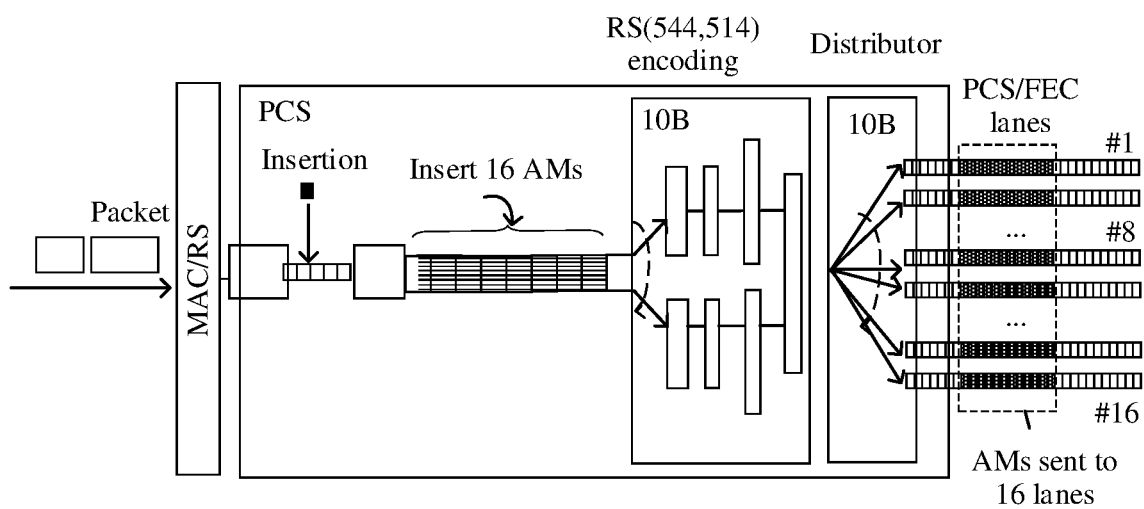

Referring to FIG. 12a, the first device sends bit streams over 16 logical lanes. During insertion of an AM group for lane alignment, the first device inserts an AM group corresponding to the 16 logical lanes. According to IEEE 802.3, a second device inserts eight 257B code blocks corresponding to 16 AMs. In other words, the second device inserts an AM group with a size of eight 257B code blocks, where the AM group includes the 16 AMs. The AM group is shown by the shaded part of a serial bit stream in FIG. 12a. Each AM in the AM group can be sent to a corresponding logical lane. The shaded parts of PCS/FEC lanes in FIG. 12a represent symbols corresponding to the AMs sent to the 16 logical lanes.

The first device sends the anchor code block. The first device inserts the anchor code block into the serial bit stream in a PCS layer. The anchor code block is used to guide the first device and the second device to switch a working mode of a physical layer, making it compatible with an existing bit stream transmission manner in Ethernet. There is no need to add a hardware structure for switching, which can reduce impact on a system.

The first device may insert an anchor code block into a 66B code block stream, where the anchor code block is a 66B code block. Alternatively, the first device may insert an anchor code block into a 257B code block stream, where the anchor code block is a 257B code block. Inserting the smaller 66B anchor code block occupies fewer resources for transmission of the anchor code block, which can reduce system overheads.

For the format of the 66B anchor code block, refer to FIG. 7. A switching type is rate reduction, and switching type information carried by the anchor code block may be "0x2". A D field of the anchor code block may be "0x2". In addition, an A field of the anchor code block may be "01", a C field may be "0x6", and the anchor code block may not be provided with a B field, that is, the number of code blocks between the trigger marker group and the anchor code block is not identified. In other words, a position of the trigger marker group in the bit stream is not identified. In this case, the position of the trigger marker group in the bit stream may be configured by the network manager. For example, according to a configuration by the network manager, 10 AM groups are inserted between the trigger marker group and the anchor code block, that is, AMs inserted the eleventh time after the anchor code block is sent are used as the trigger marker group. According to a distribution rule of an Ethernet interface, the anchor code block is distributed to a plurality of logical lanes.

At step S1002, the second device receives the anchor code block.

The second device monitors the bit stream, and receives and removes the anchor code block. The second device may receive and detect the anchor code block from the logical lanes, or may detect the anchor code block after the lanes are locked and reordered and bit streams received form a serial bit stream. After detecting the anchor code block, the second device may remove the anchor code block.

After detecting the anchor code block, the second device starts counting. According to the counting of the second device, the second device can determine the position of the trigger marker group sent by the first device.

The second device may send a response code block to the first device. The second device may send the response code block to the first device over a transmitting logical lane of the second device. The transmitting logical lane of the second device is used to send a bit stream to the first device.

If the first device does not receive the response code block before the eleventh AM insertion, switching the working mode of the physical layer is skipped, that is, steps S1003 and S1004 are not performed.

If the first device receives the response code block before the eleventh AM insertion, step S1003 is performed.

At step S1003, the first device inserts a trigger marker. The trigger marker may be an AM.

When the first device counts to the tenth AM insertion, that is, AMs have been sent 10 times since the anchor code block is sent, the first device is ready to perform the eleventh AM insertion.

Figure 12B:
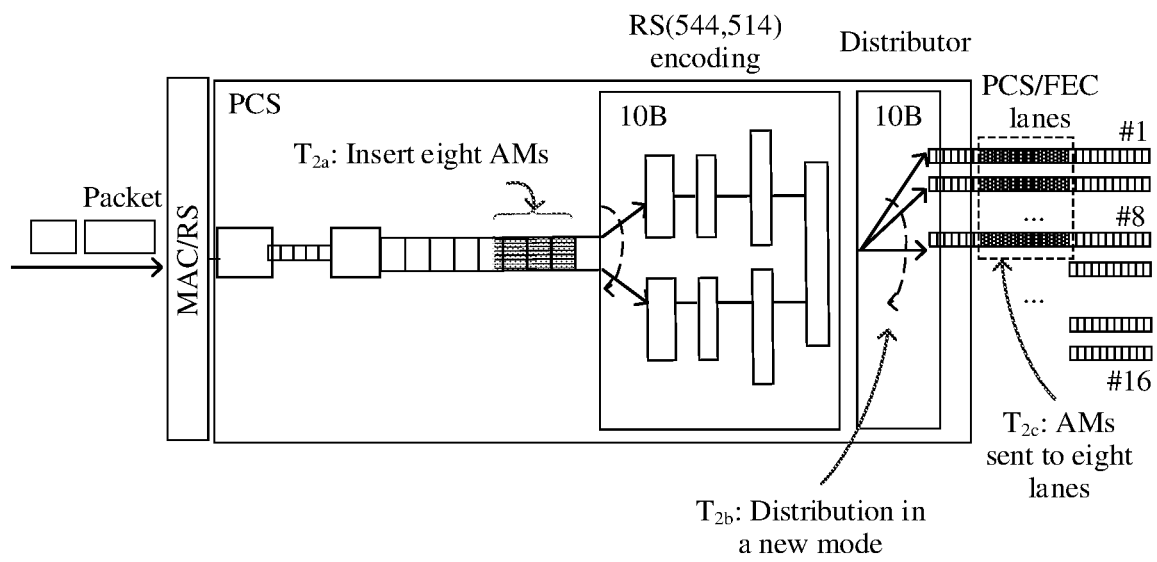

Referring to FIG. 12b, at $T_{2a}$, when an AM insertion period is reached, the first device immediately inserts eight AMs corresponding to logical lanes #1 to #8 according to a new mode. As shown by the shaded part of a serial bit stream in FIG. 12b, according to IEEE 802.3, the eight AMs correspond to four 257B code blocks. At $T_{2b}$, the inserted AMs are distributed. The AMs are distributed according to the new mode, namely, the switched mode. At $T_{2c}$, as shown by the shaded parts in the figure, each AM in PCS/FEC lanes is distributed to corresponding logical lanes #1 to #8. Starting from the eleventh AM distribution, a distributor no longer sends bit streams over logical lanes #9 to #16. The sending of the trigger marker group is a demarcation point for the distributor of the first device to work in the old and new modes, and is also a start point of the new mode.

At step S1004, the second device receives the trigger marker.

Figure 12C:
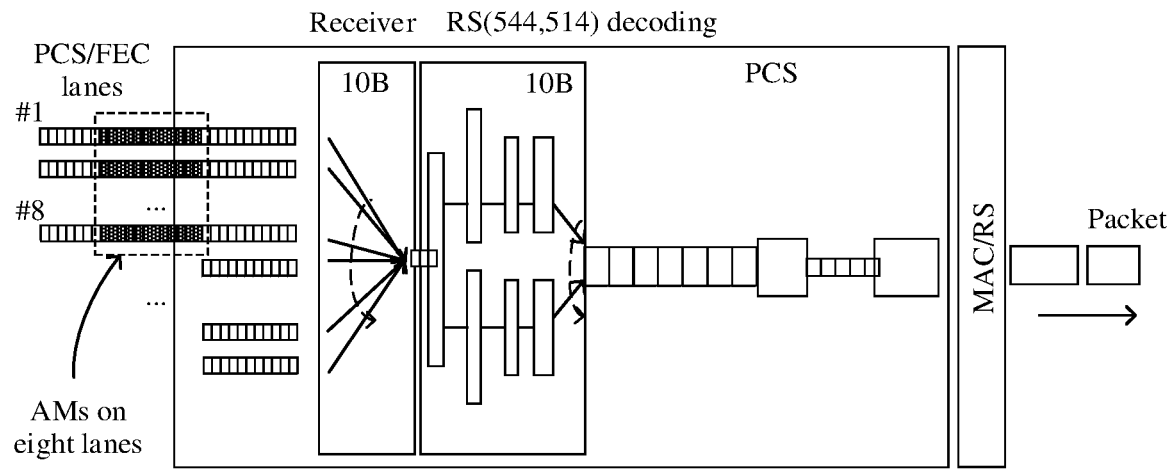

When the second device counts to the tenth AM receiving period, that is, AMs have been received 10 times since the anchor code block is received, the second device is ready to receive AMs the eleventh time. Referring to FIG. 12c, a receiver of the second device receives the eleventh round of AMs from logical lanes #1 to #8. Since the AMs are received the eleventh time, that is, the trigger marker is received, the receiver receives code blocks only from logical lanes #1 to #8, and no longer receives code blocks from #9 to #16, and switches to a new working mode. The receiving of the trigger marker group is a demarcation point for the receiver of the second device to work in the old and new modes, and is a start point of the new working mode.

Then the second device may remove the trigger marker.

In a 400G Ethernet link, the network manager configures relative positions of the trigger marker group and the anchor code block in a bit stream, and logical lanes quit running based on the sending and receiving of the anchor code block and the trigger marker group at a corresponding position. With the guidance of the anchor code block and the trigger marker group, the rate reduction switching is completed to avoid bit errors.

In another possible manner, the trigger marker group may alternatively be sent over the same logical lane as the anchor code block. In other words, after the trigger marker group is sent, switching to reduce the number of lanes is performed immediately.

At step S1003, when the first device counts to an AM insertion period, the first device still inserts 16 AMs corresponding to logical lanes #1 to #16 according to the previous mode. The distributor distributes the 16 AMs to the corresponding logical lanes #1 to #16. After the distributor completes the eleventh AM distribution to logical lanes #9 to #16, bit streams are no longer sent over logical lanes #9 to #16, and logical lanes #9 to #16 quit running.

Correspondingly, at step S1004, when the second device counts to the eleventh AM receiving period, the second device still receives 16 AMs according to the previous mode, namely, the 16 AM corresponding to logical lanes #1 to #16, and the 16 AMs are used as the trigger marker group. After the receiver receives the trigger marker group, bit streams are no longer received from logical lanes #9 to #16, and logical lanes #9 to #16 quit running.

The position of the trigger marker group in a bit stream is determined based on the sending and receiving of the anchor code block. The trigger marker is used to guide some of the logical lanes of the first device and the second device to quit running, so that the rate reduction switching can be implemented to avoid bit errors.

By means of the foregoing steps, based on the trigger marker of the physical layer, switching of working modes of the first device and the second device is completed, and a higher-rate mode is switched to a lower-rate mode. For a same symbol in a bit stream, the second device and the first device perform corresponding processing, and there is no code block or bit error. There is no need to provide a buffer or a packet reordering module, having little impact on the system. The trigger marker reuses an AM, which reduces the number of bits occupied by the sending of the trigger marker group, and reduces implementation costs, making it simple and efficient.

A trigger marker sent to each logical lane may be an AM sent over the logical lane at a specific time. An AM sent over each PCSL uniquely identifies the PCSL, that is, each AM uniquely identifies the corresponding PCSL, and is sent over the corresponding PCSL. Table 3 shows an AM specification for 400G Ethernet in IEEE 802.3. $CM_0$, $CM_1$, $CM_2$, $CM_3$, $CM_4$, and $CM_5$ are common identifiers of logical lanes, and $UM_0$, $UM_1$, $UM_2$, $UM_3$, $UM_4$, and $UM_5$ uniquely identify a logical lane.

TABLE 3

| PCS lane index | AM $\{CM_0, CM_1, CM_2, UP_0, CM_3, CM_4, CM_5, UP_1, UM_0, UM_1, UM_2, UP_2, UM_3, UM_4, UM_5\}$ |
|---|---|
| 0 | 0x9A, 0x4A, 0x26, 0B6, 0x65, 0xB5, 0xD9, 0xD9, 0x01, 0x71, 0xF3, 0x26, 0xFE, 0x8E, 0x0C |
| 1 | 0x9A, 0x4A, 0x26, 0x04, 0x65, 0xB5, 0xD9, 0x67, 0x5A, 0xDE, 0x7E, 0x98, 0xA5, 0x21, 0x81 |
| 2 | 0x9A, 0x4A, 0x26, 0x46, 0x65, 0xB5, 0xD9, 0xFE, 0x3E, 0xF3, 0x56, 0x01, 0xCl, 0x0C, 0xA9 |
| 3 | 0x9A, 0x4A, 0x26, 0x5A, 0x65, 0xB5, 0xD9, 0x84, 0x86, 0x80, 0xD0, 0x7B, 0x79, 0x7F, 0x2F |
| 4 | 0x9A, 0x4A, 0x26, 0xE1, 0x65, 0xB5, 0xD9, 0x19, 0x2A, 0x51, 0xF2, 0xE6, 0xD5, 0xAE, 0x0D |
| 5 | 0x9A, 0x4A, 0x26, 0xF2, 0x65, 0xB5, 0xD9, 0x4E, 0x12, 0x4F, 0xD1, 0xB1, 0xED, 0xB0, 0x2E |
| 6 | 0x9A, 0x4A, 0x26, 0x3D, 0x65, 0xB5, 0xD9, 0xEE, 0x42, 0x9C, 0xA1, 0x11, 0xBD, 0x63, 0x5E |
| 7 | 0x9A, 0x4A, 0x26, 0x22, 0x65, 0xB5, 0xD9, 0x32, 0xD6, 0x76, 0x5B, 0xCD, 0x29, 0x89, 0xA4 |
| 8 | 0x9A, 0x4A, 0x26, 0x60, 0x65, 0xB5, 0xD9, 0x9F, 0xE1, 0x73, 0x75, 0x60, 0x1E, 0x8C, 0x8A |
| 9 | 0x9A, 0x4A, 0x26, 0x6B, 0x65, 0xB5, 0xD9, 0xA2, 0x71, 0xC4, 0x3C, 0x5D, 0x8E, 0x3B, 0xC3 |
| 10 | 0x9A, 0x4A, 0x26, 0xFA, 0x65, 0xB5, 0xD9, 0x04, 0x95, 0xEB, 0xD8, 0xFB, 0x6A, 0x14, 0x27 |

TABLE 3-continued

| PCS lane index | AM $\{CM_0, CM_1, CM_2, UP_0, CM_3, CM_4, CM_5, UP_1, UM_0, UM_1, UM_2, UP_2, UM_3, UM_4, UM_5\}$ |
|---|---|
| 11 | $0x_9A, 0x_4A, 0x_{26}, 0x6C, 0x_{65}, 0xB_5, 0xD_9, 0x_{71}, 0x_{22}, 0x_{66}, 0x_{38}, 0x8E, 0xDD, 0x_{99}, 0xC_7$ |
| 12 | $0x_9A, 0x_4A, 0x_{26}, 0x_{18}, 0x_{65}, 0xB_5, 0xD_9, 0x_5B, 0xA_2, 0xF_6, 0x_{95}, 0xA_4, 0x_5D, 0x_{09}, 0x6A$ |
| 13 | $0x_9A, 0x_4A, 0x_{26}, 0x_{14}, 0x_{65}, 0xB_5, 0xD_9, 0xCC, 0x_{31}, 0x_{97}, 0xC_3, 0x_{33}, 0xCE, 0x_{68}, 0x_3C$ |
| 14 | $0x_9A, 0x_4A, 0x_{26}, 0xD0, 0x_{65}, 0xB_5, 0xD_9, 0xB_1, 0xCA, 0xFB, 0xA6, 0x_4E, 0x_{35}, 0x_{04}, 0x_{59}$ |
| 15 | $0x_9A, 0x_4A, 0x_{26}, 0xB_4, 0x_{65}, 0xB_5, 0xD_9, 0x_{56}, 0xA_6, 0xBA, 0x_{79}, 0xA_9, 0x_{59}, 0x_{45}, 0x_{86}$ |

Figure 13:
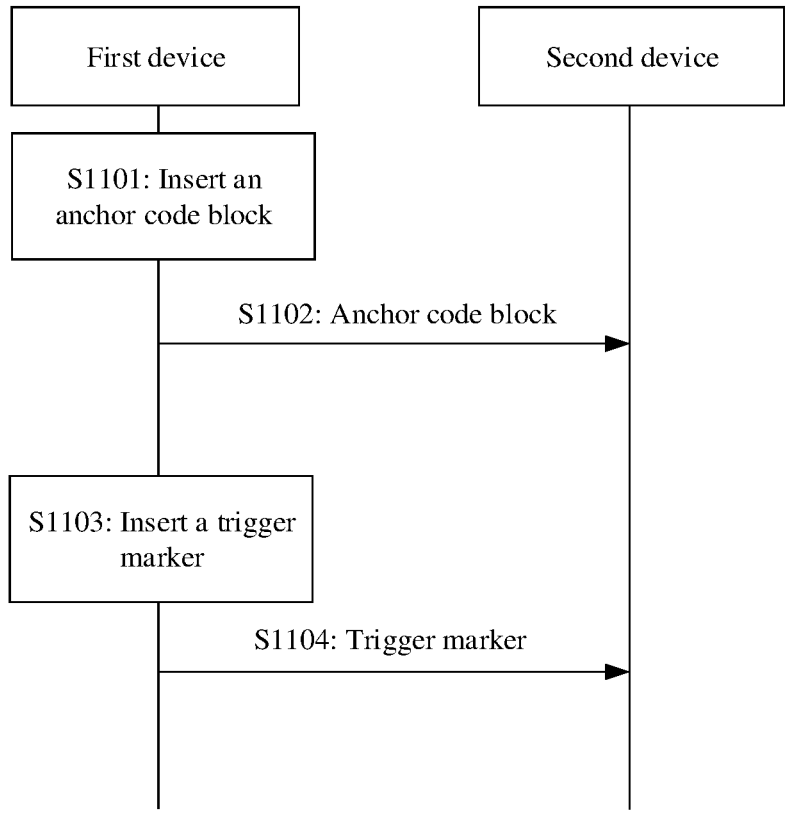
FIG. 13 is a schematic flowchart of an Ethernet data transmission method according to still another embodiment of this application.

FIG. 13 is a schematic flowchart of an Ethernet data transmission method according to an embodiment of this application. A logical lane is a PCSL For a 400G Ethernet interface, 8×50 Gbps physical lanes are electrically interconnected. Each physical lane corresponds to two logical lanes, that is, a total of 16 logical lanes are used. An RS(544,514) scheme is used for an FEC scheme. A network manager delivers an instruction to request switching from running of logical lanes #1 to #8 to running of logical lanes #1 to #16, that is, to resume logical lanes #9 to #16 that have quit running. For a correspondence between logical lanes and physical lanes, refer to FIG. 8. Logical lanes #1 and #2 correspond to physical lane #1, logical lanes #3 and #4 correspond to physical lane #2, and a correspondence between other logical lanes and physical lanes can be deduced by analogy.

At step S1101, a first device inserts an anchor code block.

Figure 14A:
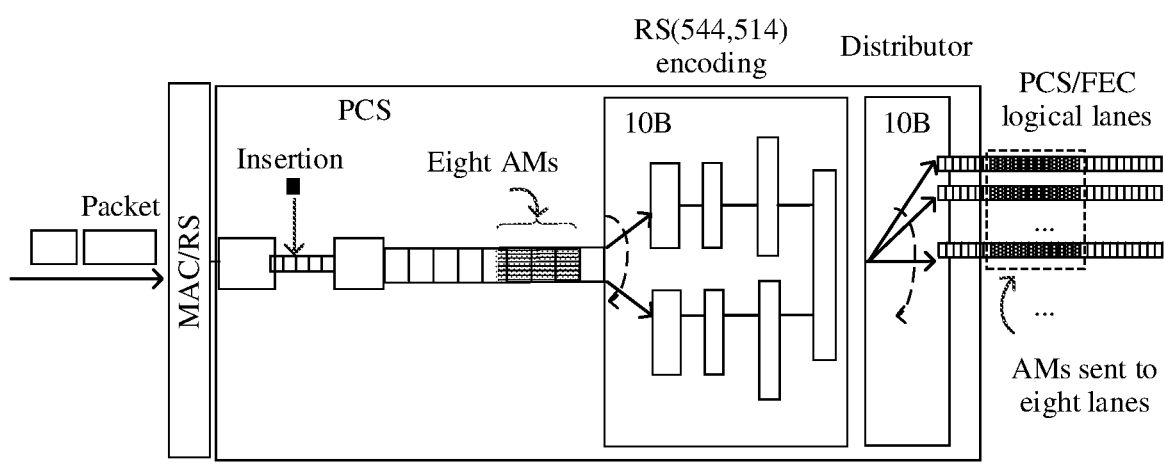
FIG. 14a to FIG. 14d are schematic diagrams of Ethernet data transmission according to another embodiment of this application.

Referring to FIG. 14a, the first device sends bit streams over eight logical lanes. During insertion of an AM for logical lane alignment, the first device inserts eight AMs corresponding to the eight lanes. Each of the eight AMs can be sent to a corresponding logical lane.

The first device sends the anchor code block. The first device inserts the anchor code block into a serial bit stream in a PCS layer. In other words, the first device includes information of the anchor code block in the bit stream sent. For the format of the anchor code block, refer to FIG. 7. The anchor code block may be provided with a B field. For example, information of the B byte indicates that M=8, that is, eight rounds of AM groups are sent between the anchor code block and a trigger marker group. In other words, each AM inserted in the ninth round after the anchor code block is sent is used as a trigger marker. A switching type is rate increasing, the anchor code block may be provided with a D field, and switching type information carried by the anchor code block may be "0x1", that is, rate increasing switching.

At step S1102, a second device receives the anchor code block.

The second device monitors the bit streams to detect the anchor code block in the received bit streams. The second device may lock and reorder the logical lanes, and detect the anchor code block after symbols received form a serial bit stream.

After detecting the anchor code block, the second device starts counting. According to the counting of the second device, the second device can determine a position of the trigger marker group sent by the first device.

Then the second device may remove the anchor code block.

At step S1103, the first device inserts a trigger marker.

When the first device counts to M and waits for a period of a next round of AM group insertion, that is, eight rounds of AMs have been sent since the anchor code block is sent, the first device is ready to perform the ninth round of AM insertion.

Figure 14B:
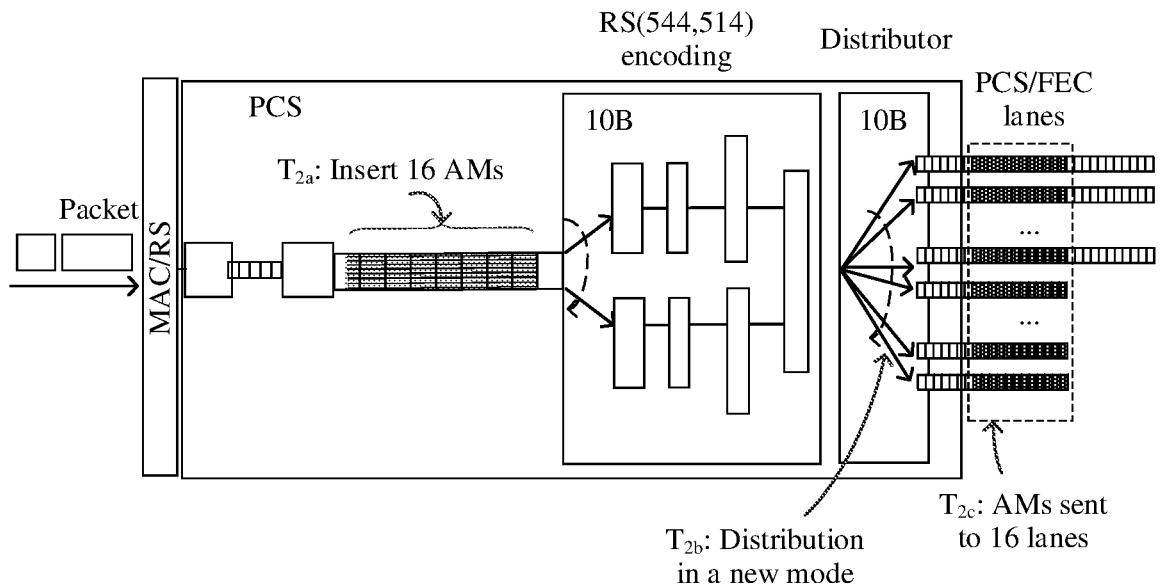

Referring to FIG. 14b, at T2a, when a period of the ninth round of AM group insertion is reached, the first device immediately inserts an AM group corresponding to 16 AMs according to a new mode. 16 is the number of logical lanes working in the new mode, that is, the AM group corresponds to logical lanes #1 to #16. At T2b, the 16 AMs are distributed. In this case, the second device uses a new mode to distribute symbols and distributes the bit stream to the 16 logical lanes. At T2c, each AM is distributed to the corresponding logical lanes #1 to #16. When a distributor performs the ninth round of AM distribution, logical lanes #9 to #16 are resumed, and the bit stream is sent over logical lanes #1 to #16. The sending of the trigger marker group is a demarcation point for the distributor of the first device to work in the old and new modes, and is also a start point of the new mode.

At step S1104, the second device receives the trigger marker.

Figure 14C:
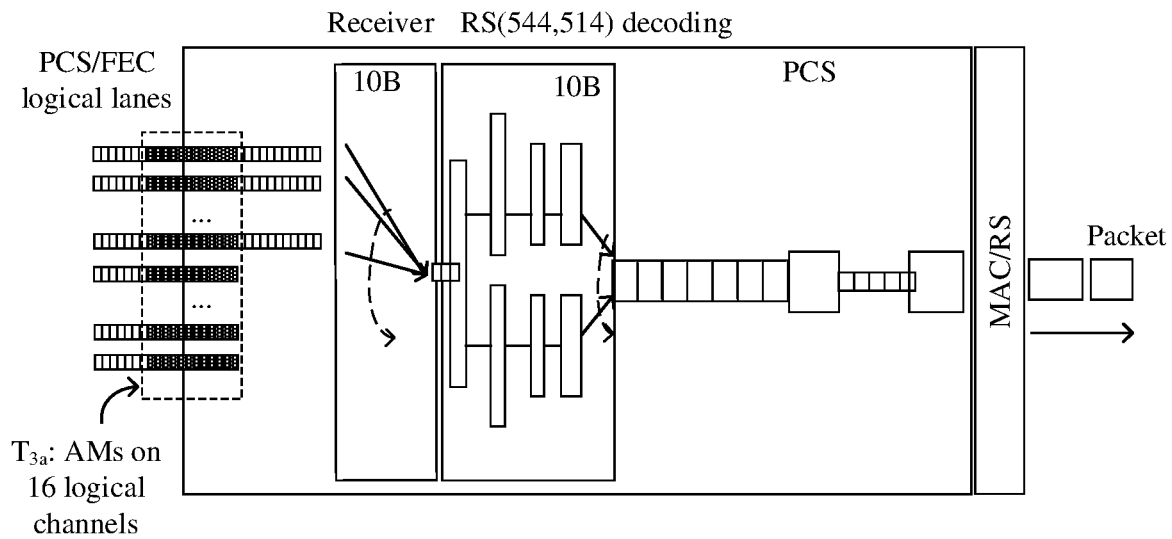
Figure 14D:
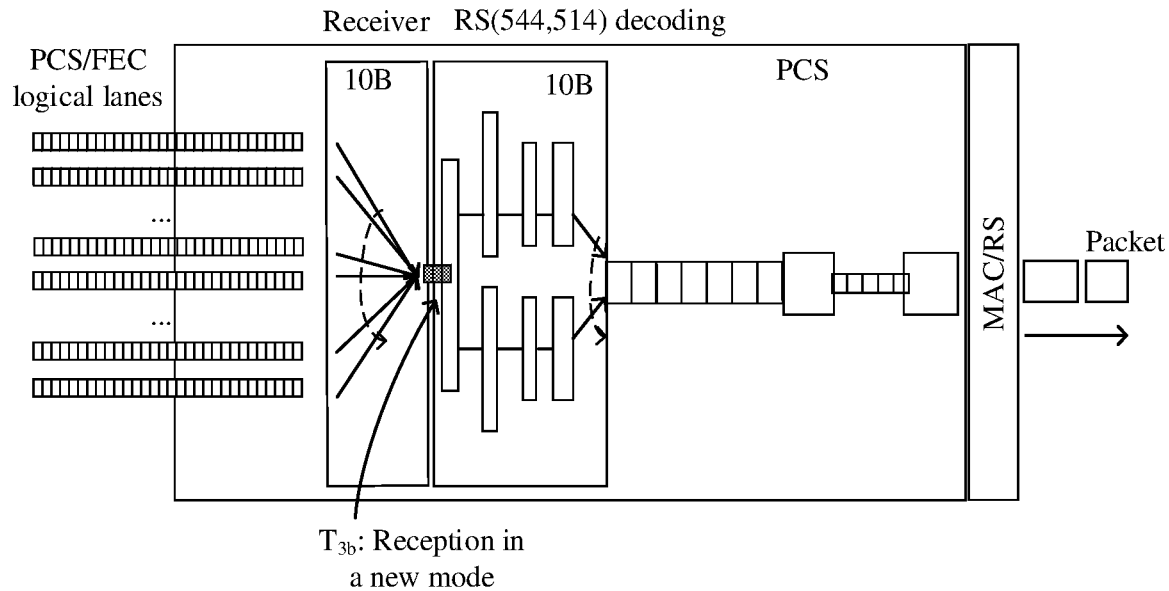

The second device counts to M and waits for a next period of AM receiving, that is, eight rounds of AMs have been received since the anchor code block is received, the second device is ready for the ninth round of AM receiving. Referring to FIG. 14c, at T3a, 16 AMs are transmitted over the 16 logical lanes, respectively. Referring to FIG. 14d, at T3b, a receiver monitors and receives the ninth round of AMs from logical lanes #1 to #16, respectively. Since the AMs are received the ninth time, that is, the trigger marker group is received, the receiver receives bit streams from logical lanes #1 to #16, and switches to a new working mode. The receiving of the trigger marker group is a demarcation point for the receiver of the second device to work in the old and new modes, and is a start point of the new mode.

The first device sends the anchor code block on a 400G link, and the first device agrees with the second device that after eight rounds of AM groups are sent, when the ninth round of AMs are sent, logical lanes #9 to #16 are resumed, and bit streams are sent over logical lanes #1 to #16. When the first device inserts the ninth round of AM group, 16 AMs inserted in the ninth round are used to guide the first device and the second device to complete the rate increasing switching.

Then the second device may remove the trigger marker.

The position of the trigger marker group in a bit stream can be determined based on the transmission of the anchor code block. By means of the transmission of the trigger marker group, for a same symbol in a bit stream, the second device and the first device perform corresponding processing, and there is no code block or bit error. For switching from a lower-rate mode to a higher-rate mode or another working mode of the physical layer, there is no need to provide a buffer or a packet reordering module, having little impact on the system. The trigger marker in the trigger marker group that corresponds to each logical lane may reuse the AM corresponding to the logical lane, which reduces the number of bits occupied by the sending of the trigger marker group, and reduces system resources occupied by the switching of the working mode, making it simple and efficient. There is no need to provide a buffer or a packet reordering module, having little impact on the system.

Figure 15:
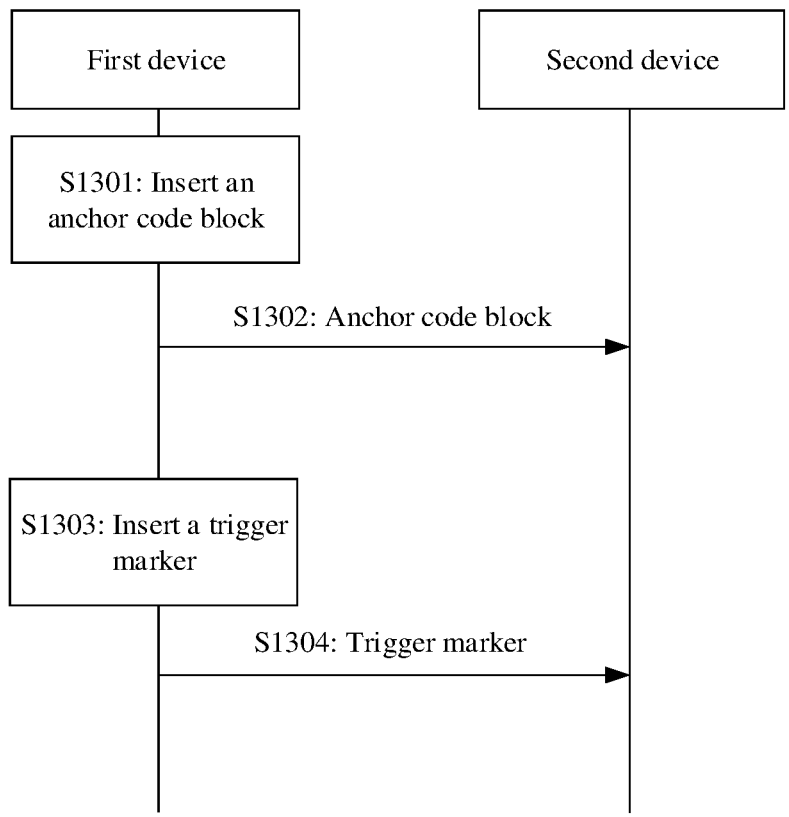
FIG. 15 is a schematic flowchart of an Ethernet data transmission method according to still another embodiment of this application.

FIG. 15 is a schematic flowchart of an Ethernet data transmission method according to an embodiment of this application.

To facilitate the description of a switching process, in this embodiment of this application, different boxes or lines are used to indicate different FEC encoding and decoding schemes or a case of no FEC encoding. It should be understood that different FEC encoding schemes may be implemented by the same or different physical components.

Before switching, a first device sends a first bit stream to a second device.

The first bit stream is encoded by using a first FEC encoding scheme. Then the second device receives the first bit stream and performs first FEC decoding on the first bit stream.

Alternatively, the first bit stream has not undergone FEC encoding. Then the second device receives the first bit stream, without performing FEC decoding on the first bit stream.

After the switching, the first device sends a second bit stream to the second device.

The second bit stream is encoded by using a second FEC encoding scheme. Then the second device receives the second bit stream, and performs second FEC decoding on the second bit stream.

Alternatively, the second bit stream has not undergone FEC encoding. Then the second device receives the second bit stream, without performing FEC decoding on the second bit stream.

At least one of the first bit stream and the second bit stream has undergone FEC encoding.

A 100G Ethernet interface is used as an example to describe a processing procedure of latency reduction switching. A logical lane is a FECL. For example, before the switching, the first device performs first FEC encoding to obtain a bit stream. After the switching, the first device does not perform FEC encoding. The first FEC encoding scheme may be, for example, RS(544,514).

For the 100G Ethernet interface, the FEC encoding scheme is switched from RS(544,514) to no FEC encoding.

The first device performs the first FEC encoding, and sends the bit stream over four FECLs. The first device inserts an AM group for FECL alignment. Each AM in the AM group can be sent to a corresponding FECL. In a trigger marker group, a trigger marker may correspond to an AM.

At step S1301, the first device inserts an anchor code block.

Figure 16A:
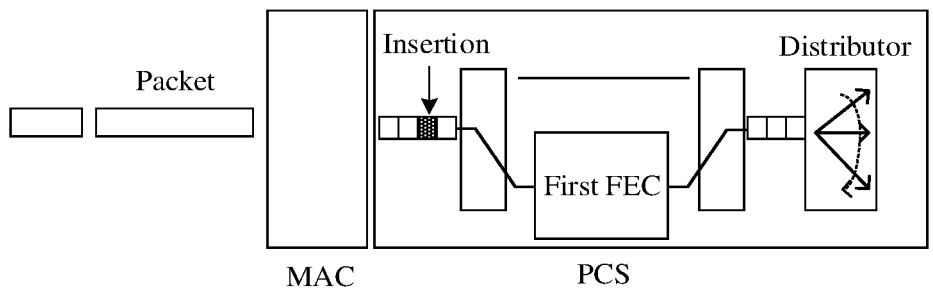
FIG. 16a to FIG. 16c are schematic diagrams of Ethernet data transmission according to still another embodiment of this application.

Referring to FIG. 16a, before performing FEC encoding on a bit stream, the first device inserts an anchor code block into a serial bit stream. The anchor code block is a code block shaded in FIG. 16a. The first device inserts the anchor code block into the bit stream. For the format of the anchor code block, refer to FIG. 6. The anchor code block may be provided with a B byte. For example, information of the B byte indicates that M=8, that is, there are eight rounds of AM groups between a trigger marker group and the anchor code block. In other words, a plurality of AMs in the ninth round inserted after the anchor code block is sent are the trigger marker group. A switching type is latency reduction, the anchor code block may be provided with a D field, and switching type information carried by the anchor code block may be "0x8", that is, a latency reduction switching indication.

At step S1302, the second device receives the anchor code block.

The second device receives the bit stream and performs first FEC decoding on the bit stream. The first FEC decoding is a decoding scheme corresponding to the first FEC encoding.

The second device monitors the bit stream to detect the anchor code block. The second device may detect the anchor code block in a serial bit stream after the plurality of lanes are locked and reordered and bit streams received form the serial bit stream, or may obtain the anchor code block in a FECL.

After receiving the anchor code block, or after detecting the anchor code block, the second device starts counting. According to the counting of the second device, the second device can determine a position of the trigger marker group sent by the first device.

The second device may remove the anchor code block.

At step S1303, the first device inserts a trigger marker.

Figure 16B:
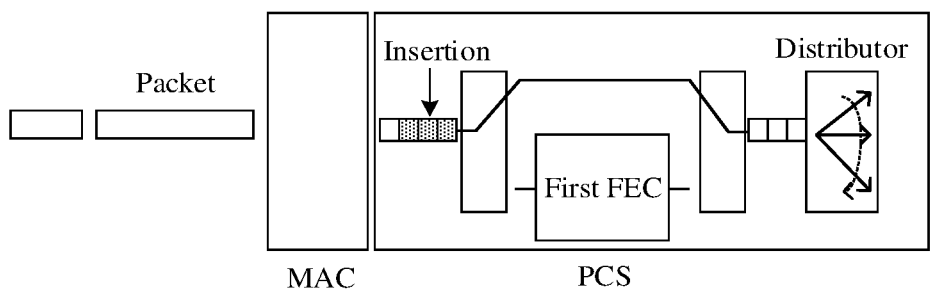

Referring to FIG. 16b, when the first device counts to M and waits for a period of a next round of AM group insertion, that is, AMs have been sent eight times since the anchor code block is sent, the first device is ready to perform the ninth round of AM insertion. A plurality of AMs inserted in the ninth round are the trigger marker group. A trigger marker corresponds to a code block shaded in FIG. 16b.

When a period of trigger marker group insertion is reached, the first device inserts the trigger marker group. Starting from the trigger marker group in the bit stream, the first device no longer performs the first FEC encoding. In other words, the first FEC encoding is no longer performed on the AM group inserted this time and a subsequent bit stream. To be specific, after a 66B code block corresponding to the AM group is transcoded into a 257B code block, the corresponding first symbol is directly distributed to four FEC lanes. The sending of the trigger marker group is a demarcation point for a distributor of the first device to work in old and new modes, and is also a start point of the new mode. A bit stream sent before the trigger marker may be referred to as the first bit stream, and a bit stream sent after the trigger marker may be referred to as the second bit stream.

At step S1304, the second device receives the trigger marker.

Figure 16C:
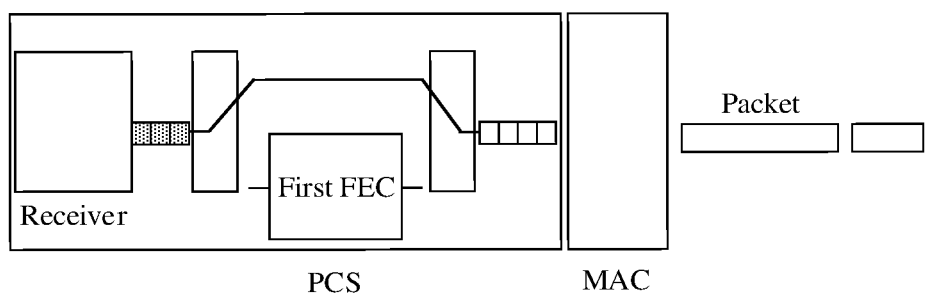

Referring to FIG. 16c, the second device counts to M and waits for a next period of AM group receiving, that is, eight rounds of AM groups have been received since the anchor code block is received, the second device is ready for the ninth round of AM receiving. A plurality of AMs inserted in the ninth round are the trigger marker group. A trigger marker corresponds to a code block shaded in FIG. 16b.

Since the ninth round of AM receiving, the second device switches to a new working mode. In other words, after symbols corresponding to this round of AMs and subsequently received symbols form 257B code blocks, the 257B code blocks are transcoded and sent as 66B code blocks. That is, the first FEC decoding is no longer performed. The receiving of the trigger marker group is a demarcation point for a receiver of the second device to work in old and new modes, and is a start point of the new mode.

The first device sends the anchor code block on a 100G link, and the first device agrees with the second device that after eight rounds of AM codewords are sent, when the ninth round of AMs are sent, latency reduction switching is performed. When the first device inserts the ninth round of AMs, the AMs inserted are used to guide the first device and the second device to complete the latency reduction switching.

Then the second device may remove the trigger marker.

A position of a trigger marker group in a bit stream can be determined based on the transmission of the anchor code block. By means of the transmission of the trigger marker group, for a same symbol in a bit stream, the second device and the first device perform corresponding processing, and there is no code block or bit error. For switching from a higher-latency mode to a lower-latency mode or another working mode of the physical layer, there is no need to provide a buffer or a packet reordering module, having little impact on the system. The trigger marker reuses the AM, which reduces the number of bits occupied by the sending of the trigger marker group, and reduces system resources occupied by the switching of the working mode, making it simple and efficient. There is no need to provide a buffer or a packet reordering module, having little impact on the system.

It should be understood that before and after the transmission latency related switching, that is, the switching of the working mode of the physical layer, different transmission latencies are caused by different FEC encoding and decoding or no FEC encoding and decoding, and therefore an error correction capability is different before and after the switching, that is, the switching may also be understood as error correction capability related switching.

In other embodiments, switching of working modes with different latencies may be completed after the trigger marker group. That is, for the first device, the trigger marker group is still encoded by using the first FEC encoding scheme. After the first FEC encoding is performed on the first trigger marker group, the first FEC encoding is no longer performed on a bit stream following the trigger marker group. Correspondingly, after receiving and detecting the trigger marker group, the second device performs the first FEC decoding on the trigger marker group. FEC decoding is no longer performed on a bit stream following the trigger marker group.

In a similar manner, working modes of the first device and the second device may also be switched from lower-latency to higher-latency. For example, before step S1303, the first device does not perform FEC encoding. As step S1303, the first device sends the trigger marker group and performs the first FEC encoding on the trigger marker group and a subsequent bit stream. At step S1304, the second device detects the trigger markers corresponding to the trigger marker group and performs the first FEC decoding on the trigger marker group and a subsequent bit stream.

Figure 17:
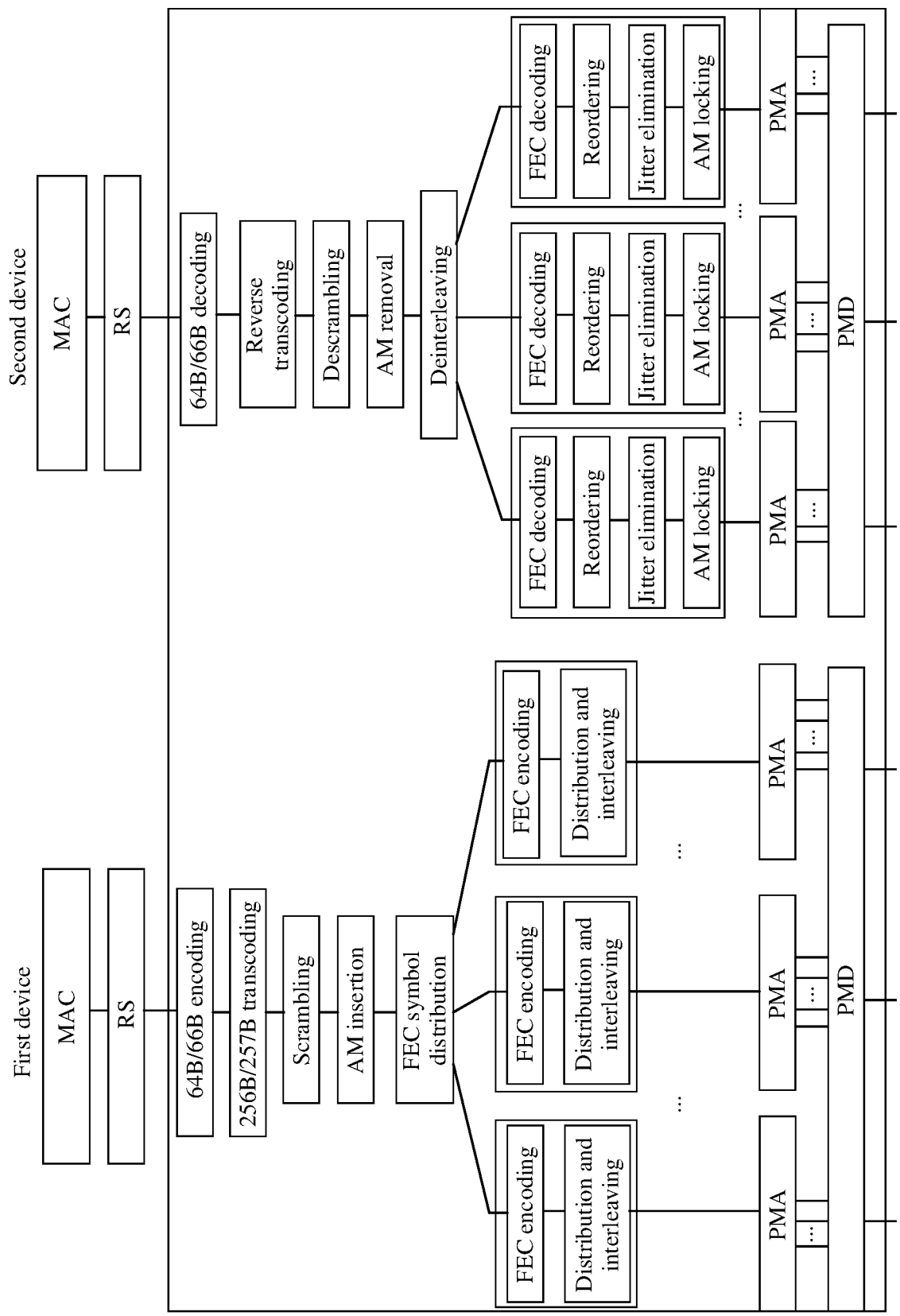
FIG. 17 is a schematic flowchart of still another Ethernet data transmission method.

FIG. 17 is a schematic flowchart of an Ethernet data transmission method, which mainly describes related processing processes of a physical layer.

Referring to FIG. 17, after AM insertion, a 257B code block stream is distributed to a plurality of lanes according to 10-bit symbols for FEC encoding and symbol distribution. A lane that independently performs FEC encoding (one or more encoders) and symbol distribution may also be referred to as a logical lane.

After the first device distributes the code block stream to a plurality of logical lanes, each logical lane independently performs FEC encoding on the bit stream, and independently performs distribution and interleaving. Each logical lane may correspond to a plurality of lanes of FEC encoding and decoding, and the plurality of lanes of FEC encoding and decoding use a same scheme. For the first device, each logical lane independently performed symbol distribution after the plurality of lanes of FEC encoding. For the second device, each logical lane performs a plurality of lanes of FEC decoding after independently performing symbol reception.

Each lane that independently performs FEC encoding and decoding, and symbol distribution and reception may be understood as a logical lane. That is, the first device distributes the code block stream to a plurality of logical lanes. A FEC scheme for each logical lane may be the same or different.

In the first device, each logical lane, namely, each lane that independently performs FEC encoding and symbol distribution, corresponds to a plurality of PCSLs. That is, symbols in each lane that performs FEC encoding are distributed to a plurality of PCSLs corresponding to the lane. The symbols on the PCSLs are sent to the second device by means of a PMA sublayer and a PMD sublayer.

As a receiver, the second device receives, via PMD and PMA, the symbols sent the first device. For each logical lane that independently performs FEC encoding and symbol reception, the receiver locks the lane and eliminates jitter by using AMs on a plurality of PCSLs corresponding to the lane. Locking and jitter eliminating may be implemented based on AMs on all PCSLs corresponding to all logical lanes. It should be understood that all the PCSLs may be aligned, or all PCSLs corresponding to one or more logical lanes may be aligned. Reordering and FEC decoding are performed on the plurality of PCSL lanes corresponding to the lane. After the FEC decoding, a PCS sublayer of the second device deinterleaves the symbols on the plurality of logical lanes (the logical lanes are reordered as required before deinterleaving) to form a serial code block stream, and perform subsequent processing procedure.

The foregoing method is applicable to 200G, 400G, and other higher-speed Ethernet interfaces. When each logical lane uses one 100G FEC codec specified by IEEE 802.3, it may be understood that for 200G Ethernet, each logical lane corresponds to one 100G FEC independent encoding and decoding and symbol distribution path, and a 200G interface includes two such logical lanes. It may be understood that when each logical lane uses two FEC encoding and decoding and distribution paths of 200G specified by IEEE 802.3, a 400G Ethernet interface includes two such logical lanes. In specific application, other processing processes may be added, or some of the foregoing processing processes may be omitted.

Figure 18:
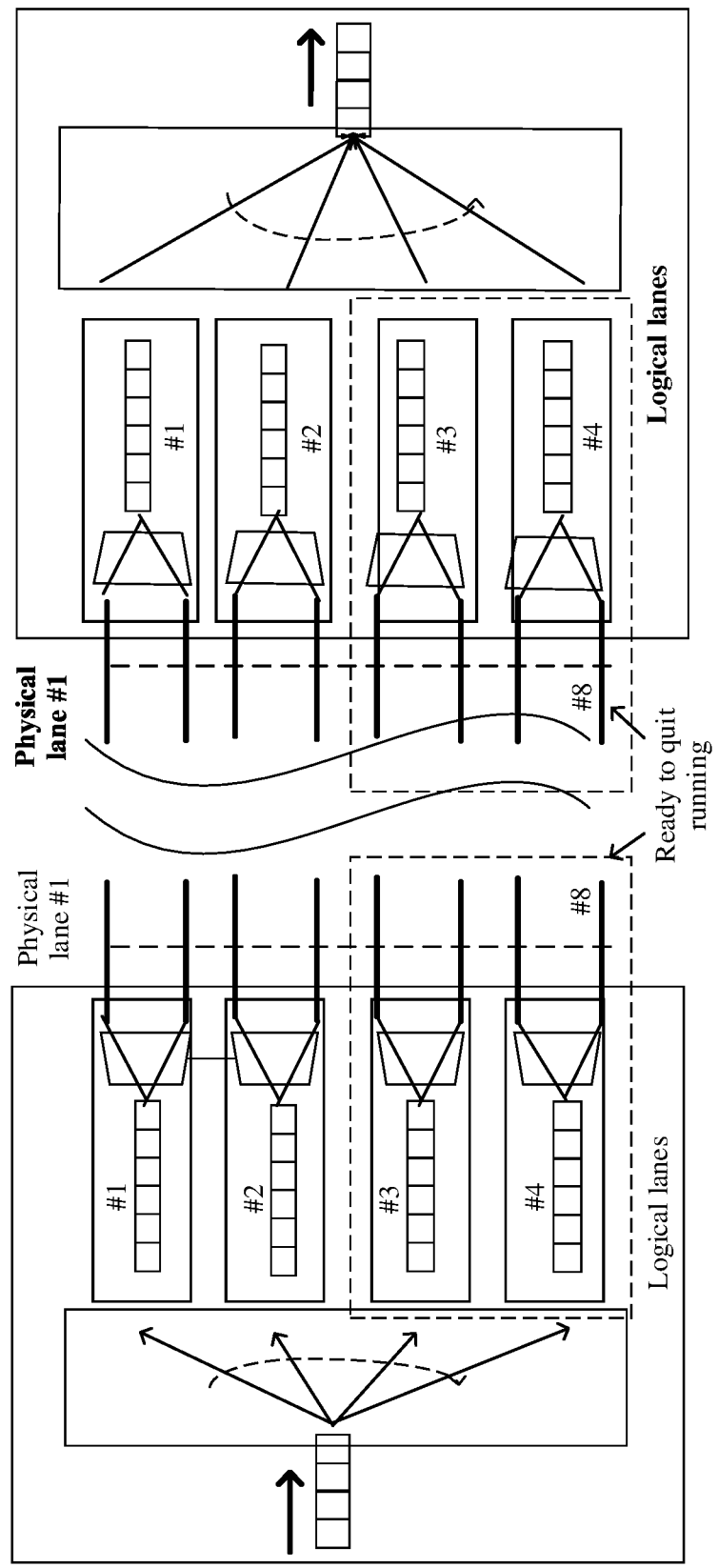
FIG. 18 is a schematic flowchart of an Ethernet data transmission method according to still another embodiment of this application.

FIG. 18 is a schematic flowchart of an Ethernet data transmission method according to an embodiment of this application.

An Ethernet interface corresponds to four lanes that each independently perform FEC encoding and symbol distribution. After symbols in each lane that performs FEC encoding are distributed to a plurality of PCSLs/FECLs, the symbols are distributed to one or more physical lanes via PMA. In other words, one lane that performs FEC encoding and symbol distribution corresponds to one or more physical lanes.

The first device and the second device may increase or decrease only the number of running PCSLs/FECLs. The first device and the second device may also increase or decrease the running lanes that independently perform FEC encoding and symbol distribution, so as to further reduce system power consumption.

A logical lane is used to represent a lane that independently performs FEC encoding and distribution. Logical lane #1 corresponds to physical lanes #1 and #2, logical lane

2 correspond to physical lanes #3 and #4, and a correspondence between other logical lanes and physical lanes can be deduced by analogy.

Because each logical lane independently performs FEC encoding and distribution, PCSLs/FECLs corresponding to each logical lane may be indexed separately. To be specific, PCSLs/FECLs #1 to #4 corresponding to logical lane #1 correspond to physical lane #1 and #2; and PCSLs/FECLs #1 to #4 corresponding to logical lane #2 correspond to physical lanes #3 and #4. Alternatively, the PCSLs/FECLs corresponding to the logical lane over which a 257B serial code block stream is transmitted may be indexed together.

A distributor in the first device is used to perform FEC symbol distribution in FIG. 17. A receiver in the second device is used to perform deinterleaving in FIG. 17.

A network manager may deliver logical lane indication information to indicate some logical lanes to quit running. For example, the network manager instructs logical lanes #3 and #4 to quit running.

Figure 19:
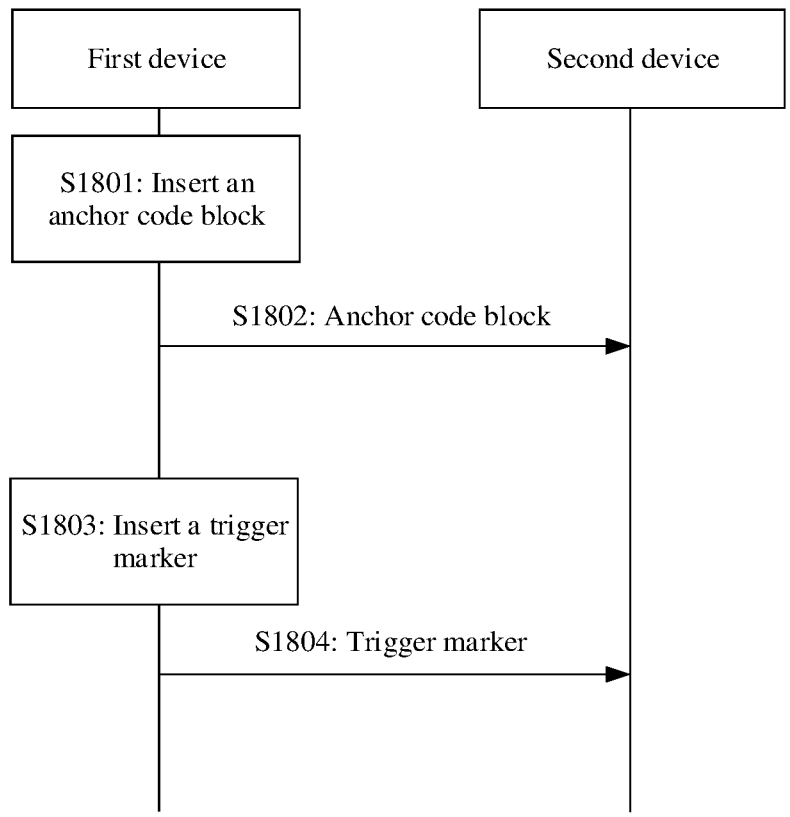
FIG. 19 is a schematic flowchart of an Ethernet data transmission method according to still another embodiment of this application.

FIG. 19 is a schematic flowchart of an Ethernet data transmission method according to an embodiment of this application. In this embodiment, a logical lane is a lane that independently performs FEC encoding and symbol distribution.

At step S1801, a first device inserts an anchor code block.

Figure 20A:
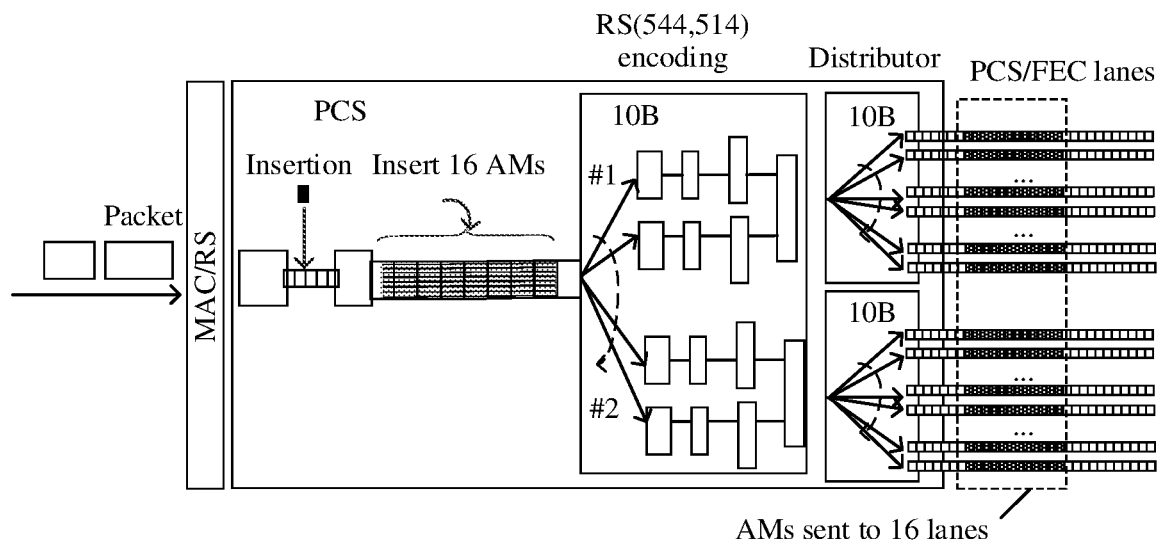
FIG. 20a to FIG. 20c are schematic diagrams of Ethernet data transmission according to still another embodiment of this application.

Referring to FIG. 20*a*, the first device sends bit streams over two logical lanes #1 and #2. PCSLs/FECLs are encoded together. Symbols in the two logical lanes are distributed to 16 PCSLs. During insertion of an AM group for lane alignment, the first device inserts an AM group corresponding to the 16 PCSLs. Each AM in the AM group can be sent to a corresponding PCSL over its corresponding logical lane.

At step S1802, a second device receives the anchor code block.

After receiving the anchor code block, or after detecting or removing the anchor code block, the second device starts counting. According to the counting of the second device, the second device can determine a position of a trigger marker group sent by the first device.

At step S1803, the first device inserts a trigger marker. The trigger marker may correspond to logical lane #1. For example, the trigger marker may reuse an AM. Trigger markers for logical lane #1 correspond to AMs for PCSLs #1 to #8, and trigger markers for logical lane #2 correspond to AMs for PCSLs #9 to #16.

Figure 20B:
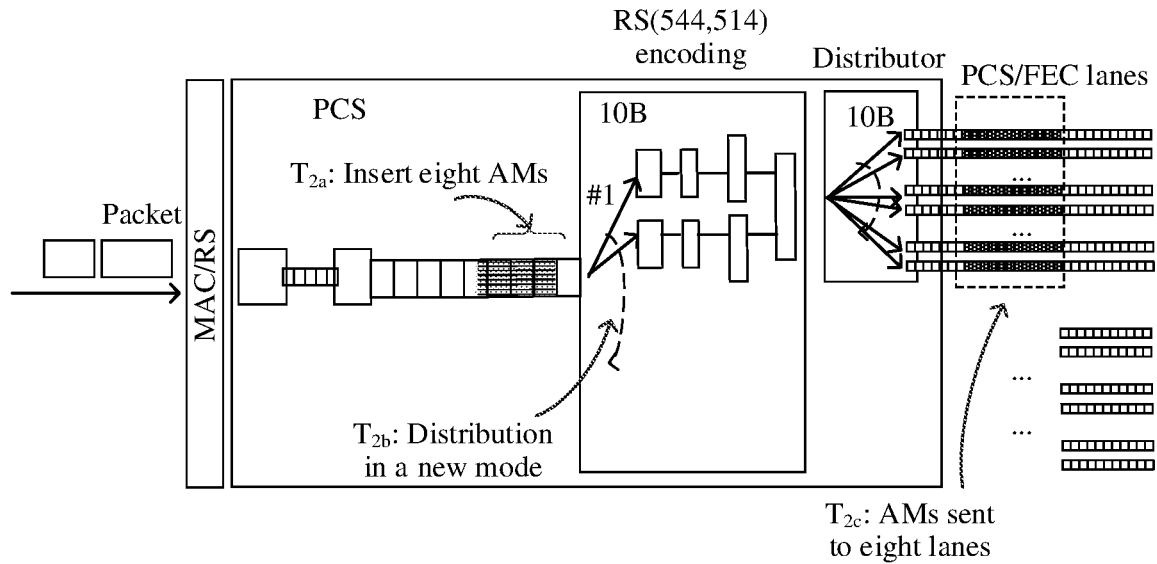

Referring to FIG. 20*b*, at $T_{2a}$, when an AM insertion period is reached, the first device immediately inserts eight AMs corresponding to PCSLs #1 to #8 according to a new mode. At $T_{2b}$, the inserted AMs are distributed. The AMs are distributed to logical lane #L At Tc, each AM is distributed to the corresponding PCSLs #1 to #8.

After step S1803, the first device no longer sends a bit stream over logical lane #2 and PCSLs #9 to #16.

At step S1804, the second device receives the trigger marker.

Figure 20C:
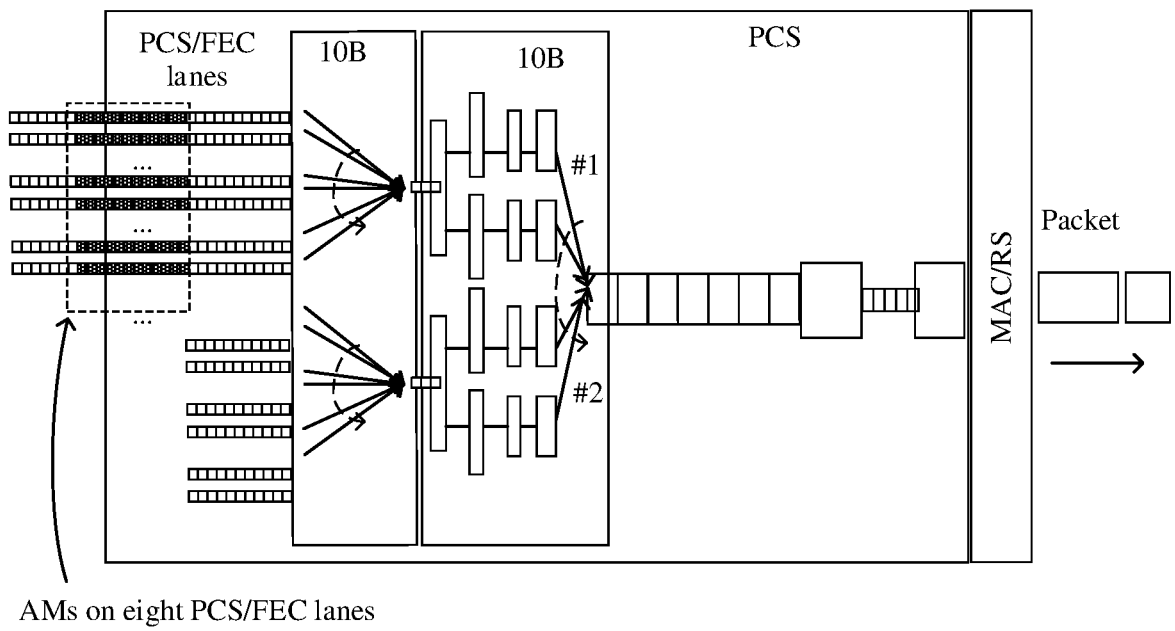

Referring to FIG. 20*c*, when the second device counts to a period of reception of an AM as a trigger marker, the trigger marker is received over PCSLs #1 to #8 and the corresponding logical lane #1.

The second device may remove the trigger marker.

Then the second device receives the bit stream over PCSLs #1 to #8 and the corresponding logical lane #1, and no longer sends the bit stream over logical lane #2 and PCSLs #9 to #16.

Figure 21:
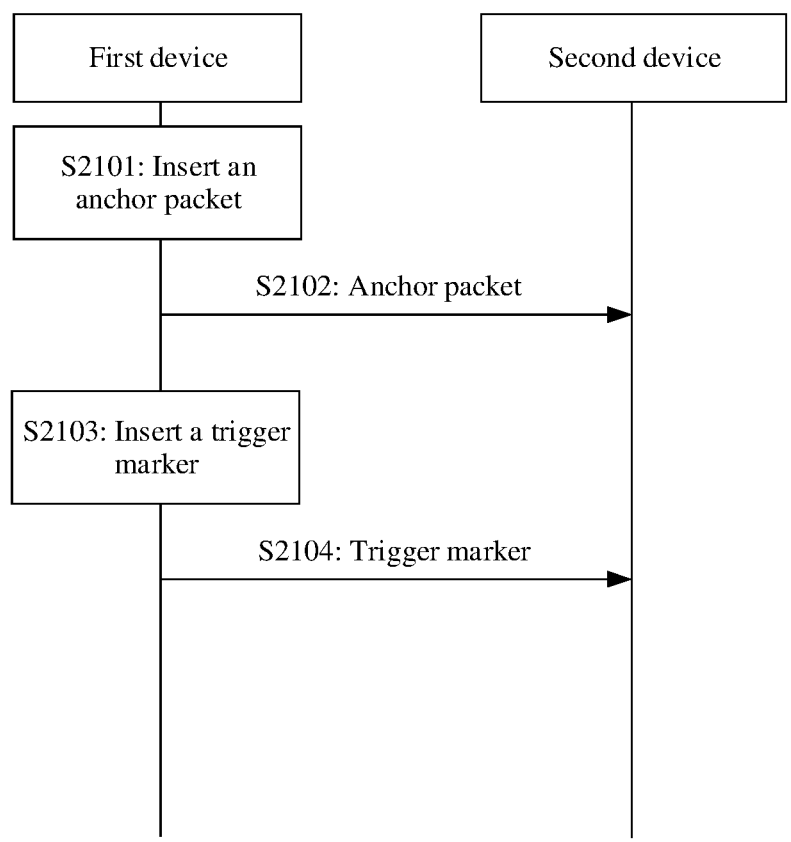
FIG. 21 is a schematic flowchart of a communication method according to an embodiment of this application.

FIG. 21 is a schematic flowchart of a communication method according to an embodiment of this application.

Anchor information may be an anchor packet.

At step S2101, a first device inserts an anchor packet.

A MAC layer of the first device receives a data packet.

The MAC layer of the first device inserts the anchor packet in a serial bit stream. For a format of the anchor packet, refer to the description of FIG. 22. The anchor packet may be used to indicate a position of a trigger marker group in the bit stream.

Preferably, the anchor packet may include switching mode indication information. The switching mode indication information is used to indicate a switching mode of a working mode. The switching mode of the working mode includes transmission rate related switching and/or transmission latency related switching. For the transmission rate related switching, before and after the switching, different numbers of logical lanes are used to send the bit stream. For the transmission latency related switching, before and after the switching, different FEC encoding schemes (including no FEC encoding) are used to obtain the bit stream.

At step S2102, the first device sends the anchor packet to a second device. According to a distribution rule of an Ethernet interface, the anchor packet is distributed to a logical lane.

The first device sends a bit stream to the second device. The bit stream includes the anchor packet. The anchor packet is used to indicate a position of a trigger marker group in the bit stream.

At step S2103, the first device inserts the trigger marker group into the bit stream according to the position of the trigger marker group indicated by the anchor packet.

At step S2104, the first device sends the trigger marker group. It should be understood that the trigger marker group is sent after the anchor packet.

The first device switches a working mode when starting to send the trigger marker group or when finishing sending the trigger marker group.

The second device receives the bit stream. The bit stream includes the anchor packet and the trigger marker group. After receiving the anchor packet, MAC of the second device switches a working mode according to the position of the trigger marker group indicated by the anchor packet in the bit stream when starting to receive the trigger marker group or when finishing receiving the trigger marker group.

It should be understood that a switching time of the working mode of the second device corresponds to a switching time of the working mode of the first device. If the working mode of the first device is switched when the trigger marker group is started to be sent, the second device switches the working mode when starting to receive the trigger marker group.

After receiving the anchor packet, the second device may remove the anchor packet from the bit stream.

After receiving the trigger marker group, the second device may remove the trigger marker group from the bit stream.

By means of steps S2101 to S2104, synchronous switching of the working modes of the first device and the second device can be completed based on the anchor packet of the MAC layer, and no buffer or packet reordering module is required, which is simple and efficient.

The anchor packet may include one or more of switching mode indication information, an anchor packet identifier, trigger indication information, or the like. The switching mode indication information is used to indicate a switching mode. The switching mode includes transmission rate related switching and/or transmission latency related switching. The anchor packet identifier is used to indicate that the packet is an anchor packet. The trigger indication information is used to indicate the position of the trigger marker group in the bit stream.

Information such as the position of the trigger marker group in the bit stream may alternatively be determined according to a protocol. The trigger marker group may be an AM group or another marker group.

Figure 22:
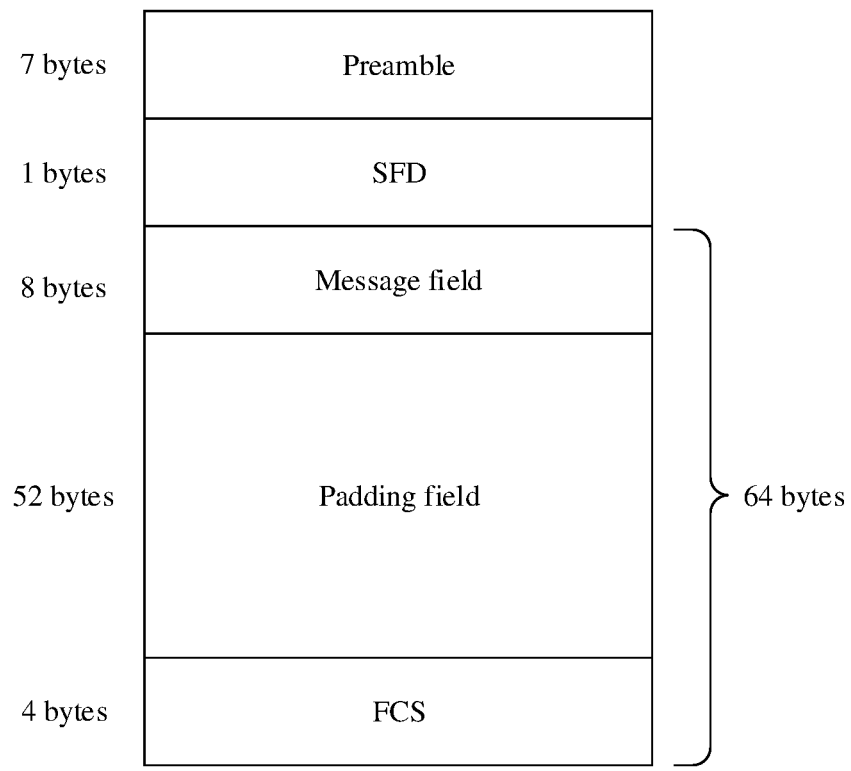
FIG. 22 is a schematic diagram of an anchor packet according to an embodiment of this application.

FIG. 22 is a schematic diagram of an anchor packet according to an embodiment of this application.

The anchor packet may include a 7-byte preamble, a 1-byte start frame delimiter (SFD), an 8-byte message field (MSG_filed), a 52-byte padding field, a 4-byte frame check sequence (FCS), or the like.

A value of the preamble may be 0x55.

The SFD may be used as an anchor packet identifier to indicate that the packet is an anchor packet. A value of the SFD may be 0xD4.

The message field may include switching mode indication information. For example, 0x0000000000000000 may indicate rate increasing, and 0x0000000000000002 may indicate rate reduction.

The foregoing describes the method embodiments in the embodiments of this application with reference to FIG. 1 to FIG. 22. The following describes apparatus embodiments in the embodiments of this application with reference to FIG. 23 to FIG. 26. It should be understood that the descriptions of the method embodiments correspond to descriptions of the apparatus embodiments. Therefore, for parts that are not described in detail, refer to the foregoing method embodiments.

Figure 23:
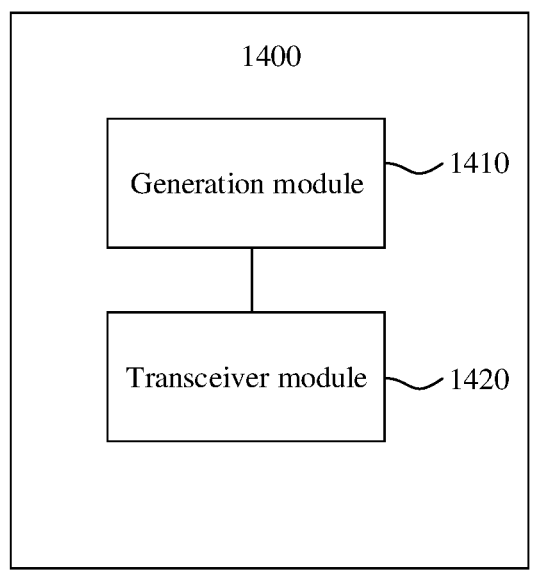
FIG. 23 is a schematic diagram of a structure of a communications device according to an embodiment of this application.

FIG. 23 is a schematic diagram of a structure of a communications device according to an embodiment of this application. The communications device 1400 is used for Ethernet data transmission.

The communications device 1400 includes a generation module 1410 and a transceiver module 1420.

The transceiver module 1420 is configured to send a first bit stream to a second device, where the first bit stream is sent over N logical lanes of a physical layer of the communications device.

The generation module 1410 is configured to generate a first trigger marker group.

The transceiver module 1420 is further configured to send the first trigger marker group to the second device, where the first trigger marker group is used to indicate that the sending of the first bit stream ends.

The transceiver module 1420 is further configured to send a second bit stream to the second device in response to the sending of the first trigger marker group, where the second bit stream is sent over P logical lanes of the physical layer of the communications device, and both N and P are positive integers.

Optionally, the first trigger marker group includes P trigger markers.

Optionally, the transceiver module 1420 is configured to send an $i^{th}$ trigger marker in the P trigger markers over an $i^{th}$ logical lane in the P logical lanes, where i is a positive integer.

Optionally, the $i^{th}$ trigger marker includes information for identifying the $i^{th}$ logical lane.

Optionally, the first bit stream is encoded by using a first forward error correction FEC encoding scheme; and the second bit stream is encoded by using a second FEC encoding scheme, where an error correction capability of the second FEC encoding scheme is different from that of the first FEC encoding scheme.

Optionally, one of the first bit stream and the second bit stream is encoded by using forward error correction FEC.

Optionally, the first bit stream includes an anchor code block, and the anchor code block is used to indicate a time at which the sending of the first bit stream ends.

Optionally, the first trigger marker group is an alignment marker AM group.

Optionally, the transceiver module 1420 is further configured to receive a response code block that corresponds to the anchor code block and that is sent by the second device; and the transceiver module 1420 is configured to send the first trigger marker group to the second device based on the response code block.

Figure 24:
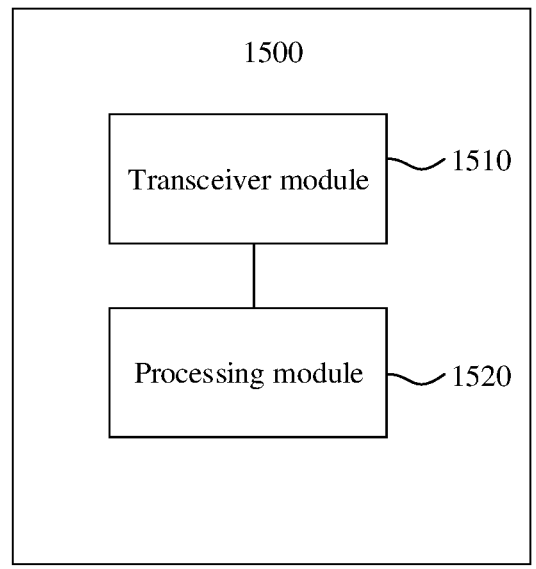
FIG. 24 is a schematic diagram of a structure of a communications device according to another embodiment of this application.

FIG. 24 is a schematic diagram of a structure of a communications device according to an embodiment of this application. The communications device 1500 is used for Ethernet data transmission.

The communications device 1500 includes a transceiver module 1510 and a processing module 1520.

The transceiver module 1510 is configured to receive a first bit stream sent by a first device, where the first bit stream is received over N logical lanes of a physical layer of the communications device.

The transceiver module 1510 is further configured to receive a first trigger marker group sent by the first device, where the first trigger marker group is used to indicate that the sending of the first bit stream ends.

The transceiver module 1510 is further configured to receive, in response to the receiving of the first trigger marker group, a second bit stream sent by the first device, where the second bit stream is received over P logical lanes of the physical layer of the communications device, and both N and P are positive integers.

The processing module 1520 is configured to process the first bit stream and the second bit stream.

Optionally, the first trigger marker group includes P trigger markers.

The transceiver module 1510 is configured to receive an $i^{th}$ trigger marker in the P trigger markers over an $i^{th}$ logical lane in the P logical lanes, where i is a positive integer.

Optionally, the $i^{th}$ trigger marker includes information for identifying the $i^{th}$ logical lane.

Optionally, the first bit stream is encoded by using a first forward error correction FEC encoding scheme; and the second bit stream is encoded by using a second FEC encoding scheme, where an error correction capability of the second FEC encoding scheme is different from that of the first FEC encoding scheme.

The processing module 1520 is configured to: decode the first bit stream by using a first FEC decoding scheme corresponding to the first FEC encoding scheme; and decode the second bit stream by using a second FEC decoding scheme corresponding to the second FEC encoding scheme.

Optionally, one of the first bit stream and the second bit stream is encoded by using forward error correction FEC.

The processing module 1520 is configured to perform FEC decoding on the bit stream encoded by using forward error correction FEC.

Optionally, the first bit stream includes an anchor code block, and the anchor code block is used to indicate a time at which the sending of the first bit stream ends.

Optionally, the first trigger marker group is an alignment marker AM group.

Optionally, the transceiver module 1510 is further configured to send a response code block corresponding to the anchor code block to the first device, where the anchor code block is used to indicate the sending of the first trigger marker group.

Figure 25:
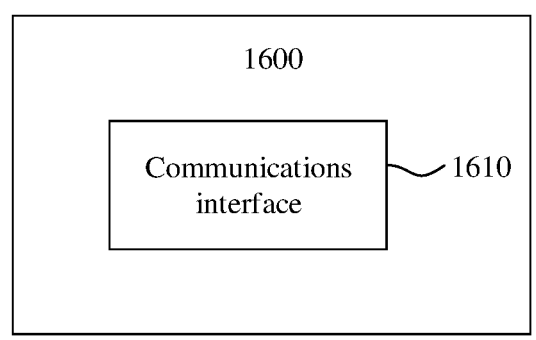
FIG. 25 is a schematic diagram of a structure of a communications device according to still another embodiment of this application.

FIG. 25 is a schematic diagram of a structure of a communications device according to an embodiment of this application. The communications device 1600 includes a communications interface 1610.

The communications interface 1610 is configured to send a first bit stream to a second device, where the first bit stream is sent over N logical lanes of a physical layer of the communications interface 1610.

The communications interface 1610 is further configured to send a first trigger marker group to the second device, where the first trigger marker group is used to indicate that the sending of the first bit stream ends.

The communications interface 1610 is further configured to send a second bit stream to the second device in response to the sending of the first trigger marker group, where the second bit stream is sent over P logical lanes of the physical layer of the communications interface 1610, and both N and P are positive integers.

Optionally, the communications device 1600 includes a processor, configured to generate a first trigger marker group.

Optionally, the first trigger marker group includes P trigger markers.

Optionally, the communications interface 1610 is configured to send an $i^{th}$ trigger marker in the P trigger markers over an $i^{th}$ logical lane in the P logical lanes, where i is a positive integer.

Optionally, the $i^{th}$ trigger marker includes information for identifying the $i^{th}$ logical lane.

Optionally, the first bit stream is encoded by using a first forward error correction FEC encoding scheme; and the second bit stream is encoded by using a second FEC encoding scheme, where an error correction capability of the second FEC encoding scheme is different from that of the first FEC encoding scheme.

Optionally, one of the first bit stream and the second bit stream is encoded by using forward error correction FEC.

Optionally, the first bit stream includes an anchor code block, and the anchor code block is used to indicate a time at which the sending of the first bit stream ends.

Optionally, the first trigger marker group is an alignment marker AM group.

Optionally, the communications interface 1610 is further configured to receive a response code block that corresponds to the anchor code block and that is sent by the second device; and the communications interface 1610 is configured to send the first trigger marker group to the second device based on the response code block.

Figure 26:
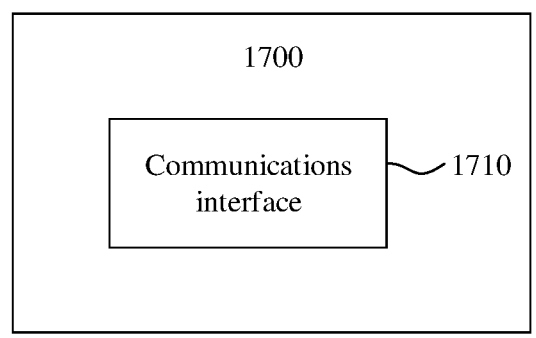
FIG. 26 is a schematic diagram of a structure of a communications device according to still another embodiment of this application.

FIG. 26 is a schematic diagram of a structure of a communications device according to an embodiment of this application. The communications device 1700 includes a communications interface 1710.

The communications interface 1710 is configured to receive a first bit stream sent by a first device, where the first bit stream is received over N logical lanes of a physical layer of the communications interface 1710.

The communications interface 1710 is further configured to receive a first trigger marker group sent by the first device, where the first trigger marker group is used to indicate that the sending of the first bit stream ends.

The communications interface 1710 is further configured to receive, in response to the receiving of the first trigger marker group, a second bit stream sent by the first device, where the second bit stream is received over P logical lanes of the physical layer of the communications interface 1710, and both N and P are positive integers.

Optionally, the communications device 1700 includes a processor, configured to process the first bit stream and the second bit stream.

Optionally, the first trigger marker group includes P trigger markers.

The communications interface 1710 is configured to receive an $i^{th}$ trigger marker in the P trigger markers over an $i^{th}$ logical lane in the P logical lanes, where i is a positive integer.

Optionally, the $i^{th}$ trigger marker includes information for identifying the $i^{th}$ logical lane.

Optionally, the first bit stream is encoded by using a first forward error correction FEC encoding scheme; and the second bit stream is encoded by using a second FEC encoding scheme, where an error correction capability of the second FEC encoding scheme is different from that of the first FEC encoding scheme.

The communications device 1700 further includes a processor, where the processor is configured to: decode the first bit stream by using a first FEC decoding scheme corresponding to the first FEC encoding scheme; and decode the second bit stream by using a second FEC decoding scheme corresponding to the second FEC encoding scheme.

Optionally, one of the first bit stream and the second bit stream is encoded by using forward error correction FEC.

The communications device 1700 further includes a processor, where the processor is configured to perform FEC decoding on the bit stream encoded by using forward error correction FEC.

Optionally, the first bit stream includes an anchor code block, and the anchor code block is used to indicate a time at which the sending of the first bit stream ends.

Optionally, the first trigger marker group is an alignment marker AM group.

Optionally, the communications interface 1710 is further configured to send a response code block corresponding to the anchor code block to the first device, where the anchor code block is used to indicate the sending of the first trigger marker group.

According to an embodiment of this application, a communications system is further provided, including one or more of the foregoing communications devices.

According to an embodiment of this application, a computer program storage medium is further provided. The computer program storage medium has program instructions. When the program instructions are executed, the foregoing method is performed.

According to an embodiment of this application, a chip system is further provided. The chip system includes at least one processor. When program instructions are executed by the at least one processor, the foregoing method is performed.

A person of ordinary skill in the art may be aware that units and algorithm steps in the examples described with reference to the embodiments disclosed in this specification may be implemented by electronic hardware or a combination of computer software and electronic hardware. Whether the functions are performed by hardware or software depends on particular applications and design constraint conditions of the technical solutions. A person skilled in the art may use different methods to implement the described functions of each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments. Details are not described herein again.

In the several embodiments provided in this application, it should be understood that the disclosed system, apparatus, and method may be implemented in other manners. For example, the described apparatus embodiment is merely an example. For example, division into units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one location, or may be distributed on a plurality of network units. Some or all of the units may be selected based on actual requirements to achieve the objectives of the solutions of the embodiments.

In addition, function units in the embodiments of this application may be integrated into one processing unit, or each of the units may exist alone physically, or two or more units are integrated into one unit.

When the functions are implemented in a form of a software function unit and sold or used as an independent product, the functions may be stored in a computer-readable storage medium. Based on such an understanding, the technical solutions of this application essentially, or the part contributing to the conventional technology, or some of the technical solutions may be implemented in a form of a software product. The computer software product is stored in a storage medium, and includes several instructions for instructing a computer device (which may be a personal computer, a server, or a network device) to perform all or some of the steps of the method described in the embodiments of this application. The foregoing storage medium includes any medium that can store program code, such as a USB flash drive, a removable hard disk, a read-only memory (ROM), a random access memory (RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A method, comprising:
sending, by a first device, a first bit stream to a second device, wherein the first bit stream is sent over N logical lanes of a physical layer of the first device;
sending, by the first device, a first trigger marker group to the second device, wherein the first trigger marker group indicates that sending the first bit stream ends; and
sending, by the first device, a second bit stream to the second device in response to the sending of the first trigger marker group, wherein the second bit stream is sent over P logical lanes of the physical layer of the first device, and both N and P are positive integers.

2. The method according to claim 1, wherein the first trigger marker group comprises P trigger markers; and
wherein sending, by the first device, the first trigger marker group to the second device comprises:
sending, by the first device, for each logical lane of the P logical lanes, an $i^{th}$ trigger marker in the P trigger markers over an $i^{th}$ logical lane in the P logical lanes, wherein i is a positive integer.

3. The method according to claim 2, wherein each $i^{th}$ trigger marker comprises information for identifying the respective $i^{th}$ logical lane.

4. The method according to claim 1, wherein the first bit stream is encoded by using a first forward error correction (FEC) encoding scheme, the second bit stream is encoded by using a second FEC encoding scheme, and wherein an error correction capability of the second FEC encoding scheme is different from an error correction capability of the first FEC encoding scheme.

5. The method according to claim 1, wherein one of the first bit stream or the second bit stream is encoded using forward error correction (FEC).

6. The method according to claim 1, wherein the first bit stream comprises an anchor code block, and the anchor code block indicates a time at which sending the first bit stream ends.

7. The method according to claim 6, wherein the first trigger marker group is an alignment marker (AM) group.

8. The method according to claim 6, further comprising:
receiving a response code block, wherein the response code block corresponds to the anchor code block and is sent by the second device; and
wherein sending, by the first device, the first trigger marker group to the second device comprises:
sending, by the first device, the first trigger marker group to the second device based on the response code block.

9. A communications device, comprising:
a communications interface, configured to:
send a first bit stream to a second device, wherein the first bit stream is sent over N logical lanes of a physical layer of the communications interface;
send a first trigger marker group to the second device, wherein the first trigger marker group indicates that sending the first bit stream ends; and
send a second bit stream to the second device in response to sending the first trigger marker group, wherein the second bit stream is sent over P logical lanes of the physical layer of the communications interface, and both N and P are positive integers.

10. The communications device according to claim 9, wherein the first trigger marker group comprises P trigger markers; and
wherein the communications interface is configured to send, for each logical lane of the P logical lanes, an $i^{th}$ trigger marker in the P trigger markers over an $i^{th}$ logical lane in the P logical lanes, wherein i is a positive integer.

11. The communications device according to claim 10, wherein each $i^{th}$ trigger marker comprises information for identifying the respective $i^{th}$ logical lane.

12. The communications device according to claim 9, wherein the first bit stream is encoded using a first forward error correction (FEC) encoding scheme and the second bit stream is encoded using a second FEC encoding scheme, wherein an error correction capability of the second FEC encoding scheme is different from an error correction capability of the first FEC encoding scheme.

13. The communications device according to claim 9, wherein one of the first bit stream or the second bit stream is encoded using forward error correction (FEC).

14. The communications device according to claim 9, wherein the first bit stream comprises an anchor code block, and the anchor code block indicates a time at which sending the first bit stream ends.

15. The communications device according to claim 14, wherein the first trigger marker group is an alignment marker (AM) group.

16. The communications device according to claim 14, wherein the communications interface is further configured to:
   receive a response code block, wherein the response code block corresponds to the anchor code block and is sent by the second device; and
   send the first trigger marker group to the second device based on the response code block.

17. A communications device, comprising:
   a communications interface, configured to:
      receive a first bit stream sent by a first device, wherein the first bit stream is received over N logical lanes of a physical layer of the communications interface;
      receive a first trigger marker group sent by the first device, wherein the first trigger marker group indicates that sending the first bit stream ends; and
      receive, after receiving of the first trigger marker group, a second bit stream sent by the first device, wherein the second bit stream is received over P logical lanes of the physical layer of the communications interface, and both N and P are positive integers.

18. The communications device according to claim 17, wherein the first trigger marker group comprises P trigger markers; and
   wherein the communications interface is configured to receive, for each logical lane of the P logical lanes, an $i^{th}$ trigger marker in the P trigger markers over an $i^{th}$ logical lane in the P logical lanes, wherein i is a positive integer.

19. The communications device according to claim 18, wherein each $i^{th}$ trigger marker comprises information for identifying the respective $i^{th}$ logical lane.

20. The communications device according to claim 17, wherein the first bit stream is encoded using a first forward error correction (FEC) encoding scheme, the second bit stream is encoded using a second FEC encoding scheme, and wherein an error correction capability of the second FEC encoding scheme is different from an error correction capability of the first FEC encoding scheme; and
   wherein the communications device comprises a processor, wherein the processor is configured to:
      decode the first bit stream using a first FEC decoding scheme corresponding to the first FEC encoding scheme; and
      decode the second bit stream using a second FEC decoding scheme corresponding to the second FEC encoding scheme.

\* \* \* \* \*